US 009953111B2

(12) United States Patent
Bell et al.

(10) Patent No.: US 9,953,111 B2
(45) Date of Patent: Apr. 24, 2018

(54) SEMANTIC UNDERSTANDING OF 3D DATA

(71) Applicant: Matterport, Inc., Mountain View, CA (US)

(72) Inventors: Matthew Tschudy Bell, Palo Alto, CA (US); David Alan Gausebeck, Mountain View, CA (US); Daniel Ford, Mountain View, CA (US); Gregory William Coombe, Mountain View, CA (US)

(73) Assignee: Matterport, Inc., Mountain View, CA (US)

( * ) Notice: Subject to any disclaimer, the term of this patent is extended or adjusted under 35 U.S.C. 154(b) by 965 days.

(21) Appl. No.: 14/298,370

(22) Filed: Jun. 6, 2014

(65) Prior Publication Data
US 2016/0055268 A1 Feb. 25, 2016

(51) Int. Cl.
*G06F 17/50* (2006.01)
*G06T 19/00* (2011.01)
*G06T 17/00* (2006.01)
*G06K 9/00* (2006.01)

(52) U.S. Cl.
CPC ..... *G06F 17/5004* (2013.01); *G06K 9/00201* (2013.01); *G06K 9/00624* (2013.01); *G06T 17/00* (2013.01); *G06T 19/00* (2013.01); *G06T 2210/04* (2013.01)

(58) Field of Classification Search
USPC .............................. 703/2, 22; 382/131; 370/4
See application file for complete search history.

(56) References Cited

U.S. PATENT DOCUMENTS

| 7,362,843 | B2 * | 4/2008 | Basu | G06T 11/005 |
|---|---|---|---|---|
| | | | | 378/4 |
| 9,387,553 | B2 * | 7/2016 | Tanaka | B23K 15/0093 |
| 9,555,470 | B1 * | 1/2017 | Heneveld | F01D 5/18 |
| 2006/0062443 | A1 * | 3/2006 | Basu | G06T 11/005 |
| | | | | 382/131 |
| 2012/0041722 | A1 | 2/2012 | Quan et al. | |
| 2013/0004060 | A1 | 1/2013 | Bell et al. | |
| 2014/0043436 | A1 | 2/2014 | Bell et al. | |
| 2014/0044343 | A1 | 2/2014 | Bell et al. | |

OTHER PUBLICATIONS

Malik, J., et al., "Contour and Texture Analysis for Image Segmentation," International Journal of Computer Vision, 2001, pp. 7-27, vol. 43, No. 1, Kluwer Academic Publishers, Netherlands.
Liu, Y., et al., "Near-Regular Texture Analysis and Manipulation," 2004, pp. 368-376, ACM.

(Continued)

*Primary Examiner* — Thai Phan
(74) *Attorney, Agent, or Firm* — Amin, Turocy & Watson, LLP

(57) ABSTRACT

Systems and techniques for processing three-dimensional (3D) data are presented. Captured three-dimensional (3D) data associated with a 3D model of an architectural environment is received and at least a portion of the captured 3D data associated with a flat surface is identified. Furthermore, missing data associated with the portion of the captured 3D data is identified and additional 3D data for the missing data is generated based on other data associated with the portion of the captured 3D data.

24 Claims, 16 Drawing Sheets

(56) References Cited

OTHER PUBLICATIONS

"Module sample_consensus," Point Cloud Library, http://docs.pointclouds.org/1.7.0/group__sample__consensus.html, Last accessed Jul. 14, 2014, 6 pages.
"Texture synthesis," Wikipedia, http://en.wikipedia.org/wiki/Texture_synthesis, Last accessed Jul. 14, 2014, 5 pages.
"Geometric primitive," Wikipedia, http://en.wikipedia.org/wiki/Geometric_primitive, Last accessed May 8, 2014, 2 pages.
Haumont, D., et al., "Volumetric cell-and-portal generation," EUROGRAPHICS, 2003, 10 pages, vol. 22, No. 3, Blackwell Publishers.
Campbell, N., et al., "Automatic 3D Object Segmentation in Multiple Views using Volumetric Graph-Cuts," Image and Vision Computing, Jan. 2010, 10 pages.
Caselles, V., et al. "Minimal Surfaces Based Object Segmentation," IEEE Transactions on Pattern Analysis and Machine Intelligence, Apr. 1997, pp. 394-398, vol. 19, No. 4.
Björkman, M., et al., "Active 3D scene segmentation and detection of unknown objects," IEEE International Conference on Robotics and Automation, 2010, 7 pages.
Merchán, P., et al., "3D Complex Scenes Segmentation from a Single Range Image Using Virtual Exploration," IBERAMIA, 2002, 10 pages.
Cignoni, P., et al., "A comparison of mesh simplification algorithms," Sep. 25, 1997, 29 pages.
Lee, H., et al., "Angle-Analyzer: A Triangle-Quad Mesh Codec," EUROGRAPHICS, 2002, 10 pages, vol. 21, No. 3, Blackwell Publishers.
Pfister, H., et al., "Surfels: Surface Elements as Rendering Primitives," SIGGRAPH, 2000, pp. 335-342, New Orleans, LA.
"Primitive," Second Life Wiki, http://wiki.secondlife.com/wiki/Primitive, Last accessed May 8, 2014, 4 pages.
International Search Report for PCT Application Serial No. PCT/US15/33746, dated Sep. 4, 2015, 13 pages.
Sturm, J., et al., "Vision based detection for learning articulation models of cabinet doors and drawers in household environments," IEEE International Conference on Robotics and Automation, May 3-7, 2010, pp. 362-368, Anchorage, AK, retreived Aug. 13, 2015, https://vision.cs.turn.edu/_media/spezial/bib/sturm10icra. pdf.
Extended Euroepan Search Report for European Application No. 15803270.6 dated Nov. 14, 2017, 10 pages.
Dumitru et al., "Interior Reconstruction Using the 3D Hough Transform," International Archives of the Photogrammetry, Remote Sensing and Spatial Information Sciences, Feb. 25, 2013, pp. 65-72.
Antonio et al, "3D Reconstruction of Interior Wall Surfaces under Occlusion and Clutter," 2011 International Conference on 3D Imaging, Modeling, Processing, Visualization and Transmission, IEEE, May 16, 2011pp. 275-281.
Mura et al., "Robust Reconstruction of Interior Building Structures with Multiple Rooms under Clutter and Occlusions," 2013 International Conference on Computer-Aided Design and Computer Graphics, IEEE, Nov. 16, 2013, pp. 52-59.
Kim et al., "3D Scene Understanding by Voxel-CRF," 2013 IEEE International Conference on Computer Vision, IEEE, Dec. 1, 2013, pp. 1425-1432.

\* cited by examiner

SEMANTIC UNDERSTANDING OF 3D DATA

TECHNICAL FIELD

This disclosure relates generally to three-dimensional (3D) modeling, and more specifically, to processing 3D data to facilitate semantic understanding of the 3D data.

BACKGROUND

Digital three-dimensional (3D) models can be generated based on scans of architectural spaces (e.g., houses, construction sites, office spaces, etc). Often times, a 3D model generated based on scans of architectural spaces includes large amounts of unprocessed data (e.g., raw data). However, it is difficult to employ unprocessed data associated with scans of architectural spaces to accurately generate, interpret and/or modify a 3D model.

SUMMARY

The following presents a simplified summary of the specification in order to provide a basic understanding of some aspects of the specification. This summary is not an extensive overview of the specification. It is intended to neither identify key or critical elements of the specification, nor delineate any scope of the particular implementations of the specification or any scope of the claims. Its sole purpose is to present some concepts of the specification in a simplified form as a prelude to the more detailed description that is presented later.

In accordance with an implementation, a system includes at least an identification component. The identification component receives captured three-dimensional (3D) data associated with a 3D model of an architectural environment and identifies at least a portion of the captured 3D data associated with a flat surface. In an aspect, the system can additionally or alternatively include a data generation component that identifies missing data associated with the portion of the captured 3D data and generates additional 3D data for the missing data based on other data associated with the portion of the captured 3D data. In another aspect, the system can additionally or alternatively include a modification component that modifies geometry data and/or texture data for the portion of the captured 3D data. In yet another aspect, the system can additionally or alternatively include a floorplan component that generates a floorplan of the architectural environment based at least on the portion of the captured 3D data associated with the flat surface.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, implementations, objects and advantages of the present invention will be apparent upon consideration of the following detailed description, taken in conjunction with the accompanying drawings, in which like reference characters refer to like parts throughout, and in which.

DETAILED DESCRIPTION

Figure 1:
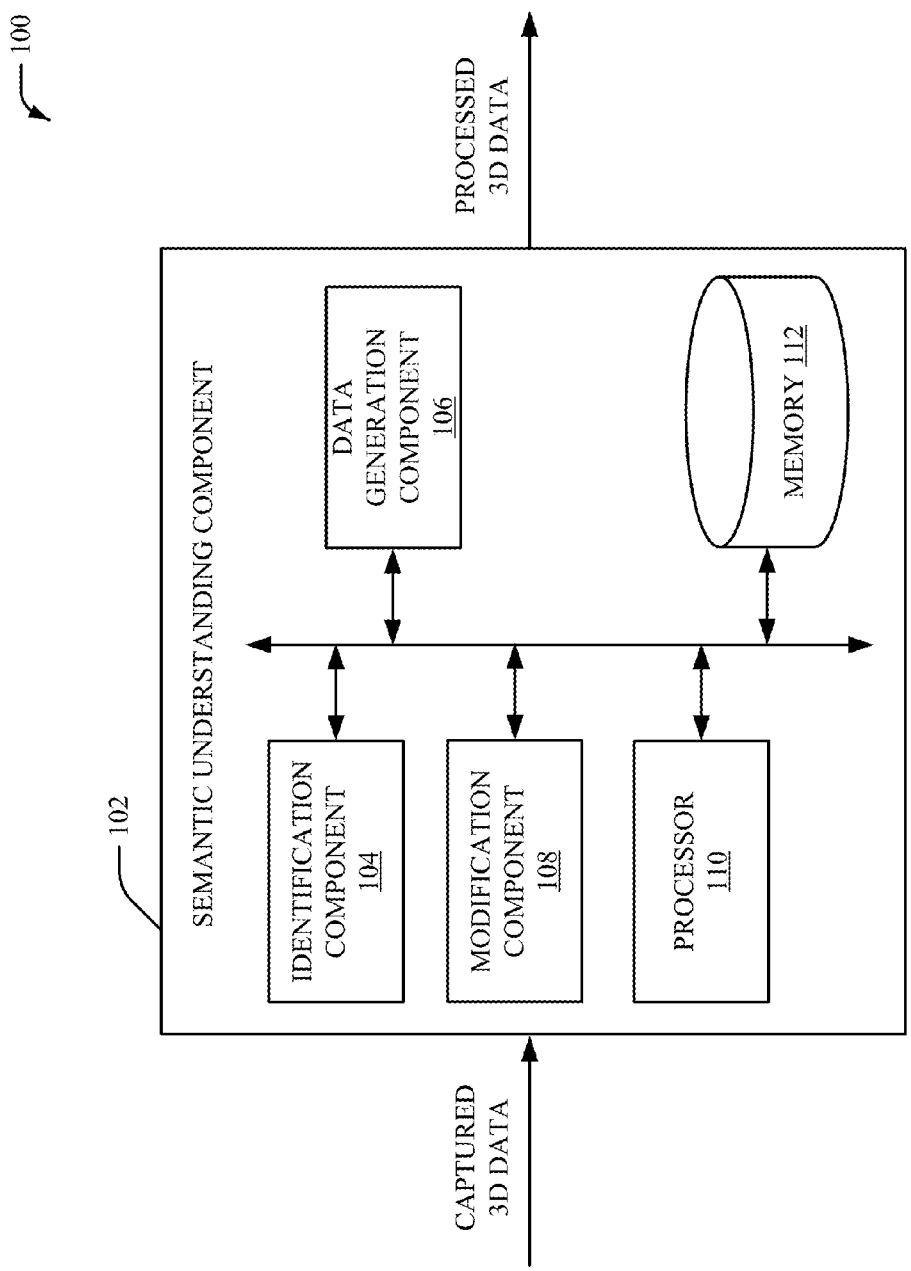
FIG. 1 illustrates a high-level block diagram of an example semantic understanding component for processing three-dimensional (3D) data, in accordance with various aspects and implementations described herein.

Various aspects of this disclosure are now described with reference to the drawings, wherein like reference numerals are used to refer to like elements throughout. In the following description, for purposes of explanation, numerous specific details are set forth in order to provide a thorough understanding of one or more aspects. It should be understood, however, that certain aspects of this disclosure may be practiced without these specific details, or with other methods, components, materials, etc. In other instances, well-known structures and devices are shown in block diagram form to facilitate describing one or more aspects.

Digital three-dimensional (3D) models can be generated based on scans of architectural spaces (e.g., houses, construction sites, office spaces, etc). Often times, a 3D model generated based on scans of architectural spaces includes large amounts of unprocessed data (e.g., raw data). However, it is difficult to employ unprocessed data associated with scans of architectural spaces to accurately generate, interpret and/or modify a 3D model.

To that end, techniques for processing 3D data (e.g., 3D-reconstructed data) to facilitate semantic understanding of the 3D data are presented. Semantic understanding of 3D data (e.g., 3D-reconstructed data) generated based on a 3D reconstruction system can facilitate automatic and/or semi-automatic generation of 3D models of real-world locations (e.g., houses, apartments, construction sites, office spaces, commercial spaces, other living spaces, other working spaces, etc.). Furthermore, semantic understanding of 3D data generated based on a 3D reconstruction system can facilitate modification of 3D models. A 3D reconstruction system can employ 2D image data and/or depth data captured from 3D sensors (e.g., laser scanners, structured light systems, time-of-flight systems, etc.) to generate the 3D data (e.g., the 3D-reconstructed data). In an aspect, flat surfaces (e.g., walls, floors and/or ceilings) and/or objects (e.g., physical objects) associated with 3D data can be identified and/or segmented. Openings (e.g., door openings and/or window openings) associated with flat surfaces can also be identified. Additionally, missing data (e.g., holes) associated with flat surfaces can be identified and/or other 3D data can be generated to supplement the missing data. Furthermore, geometry data and/or texture data for identified flat surfaces and/or objects can be modified. In one example, geometry data and/or texture data for identified flat surfaces and/or objects can be modified based on data received via a user interface (e.g., a user interface implemented on a remote client device). The identification, segmentation, augmentation and/or modification of 3D data can facilitate generation of a 3D model and/or a floorplan.

Referring initially to FIG. 1, there is illustrated a system 100 that can process 3D data (e.g., 3D-reconstructed data) to facilitate semantic understanding of the 3D data, according to an aspect of the subject disclosure. In one example, the system 100 can be implemented on or in connection with at least one server associated with 3D data (e.g., 3D-reconstructed data). The system 100 can be employed by various systems, such as, but not limited to 3D modeling systems, 3D reconstruction systems, server systems, cloud-based systems, client-side systems, and the like.

Specifically, the system 100 can provide a semantic understanding component 102 with an identification feature (e.g., identification component 104), a data generation feature (e.g., data generation component 106) and/or a modification feature (e.g., modification component 108) that can be utilized in, for example, a 3D modeling application (e.g., a 3D reconstruction application). The identification feature can receive captured three-dimensional (3D) data associated with a 3D model of an architectural environment (e.g., an interior architectural environment and/or an exterior architectural environment) and identify at least a portion of the captured 3D data associated with a flat surface. The data generation feature can identify missing data associated with the portion of the captured 3D data and generate additional 3D data for the missing data based on other data associated with the portion of the captured 3D data. The modification feature can modify geometry data and/or texture data for the portion of the captured 3D data.

In particular, the system 100 can include semantic understanding component 102. In FIG. 1, the semantic understanding component 102 includes an identification component 104, a data generation component 106 and/or a modification component 108. Aspects of the systems, apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. System 100 can include memory 112 for storing computer executable components and instructions. System 100 can further include a processor 110 to facilitate operation of the instructions (e.g., computer executable components and instructions) by system 100.

The semantic understanding component 102 (e.g., with the identification component 104) can receive captured 3D data (e.g., CAPTURED 3D DATA shown in FIG. 1). The captured 3D data can be captured 3D-reconstructed data. In one example, the captured 3D data can be raw 3D-reconstructed data. In another example, the captured 3D data can be processed and/or segmented 3D-reconstructed data. In an aspect, the captured 3D data can be generated (e.g., captured) via at least one 3D reconstruction system. For example, the at least one 3D reconstruction system can employ two-dimensional (2D) image data and/or depth data captured from one or more 3D sensors (e.g., laser scanners, structured light systems, time-of-flight systems, etc.) to automatically and/or semi-automatically generate a 3D model of an interior environment (e.g., architectural spaces, architectural structures, physical objects, . . . ). In an aspect, the 3D model can additionally be associated with an exterior architectural environment related to the interior environment. In one embodiment, the one or more 3D sensors can be implemented on a camera to capture (e.g., simultaneously capture) texture data and geometric data associated with the interior environment. In another embodiment, the one or more 3D sensors can be implemented on a mobile device (e.g., a smartphone, etc.) to capture texture data and geometric data associated with the interior environment.

A 3D model of an interior environment (e.g., the captured 3D data) can comprise geometric data and/or texture data. The geometric data can comprise data points of geometry in addition to comprising texture coordinates associated with the data points of geometry (e.g., texture coordinates that indicate how to apply texture data to geometric data). For example, a 3D model of an interior environment (e.g., the captured 3D data) can comprise mesh data (e.g., a triangle mesh, a quad mesh, a parametric mesh, etc.), one or more texture-mapped meshes (e.g., one or more texture-mapped polygonal meshes, etc.), a point cloud, a set of point clouds, surfels and/or other data constructed by employing one or more 3D sensors. In one example, the captured 3D data can be configured in a triangle mesh format, a quad mesh format, a surfel format, a parameterized solid format, a geometric primitive format and/or another type of format. For example, each vertex of polygon in a texture-mapped mesh can include a UV coordinate for a point in a given texture (e.g., a 2D texture), where U and V are axes for the given texture. In a non-limiting example for a triangular mesh, each vertex of a triangle can include a UV coordinate for a point in a given texture. A triangle formed in the texture by the three points of the triangle (e.g., a set of three UV coordinates) can be mapped onto a mesh triangle for rendering purposes. In an aspect, the captured 3D data can be unsegmented captured 3D data. For example, the captured 3D data can be 3D data that is not partitioned after being captured by one or more 3D sensors (e.g., the at least one 3D reconstruction system).

An interior environment (e.g., an indoor environment, an interior architectural environment, etc.) can include, but is not limited to, one or more rooms, one or more houses, one or more apartments, one or more office spaces, one or more construction sites, one or more commercial spaces, other living spaces, other working spaces, other environment spaces, interiors of buildings, vehicles, vessels, aircrafts, subways, tunnels, crawl spaces, equipment areas, attics, cavities, etc. Furthermore, an interior environment can include physical objects included in one or more rooms, one or more houses, one or more apartments, one or more office spaces, one or more construction sites, one or more commercial spaces, other living spaces, other working spaces and/or other environment spaces. An exterior architectural environment related to an interior environment can include, but is not limited to, a patio, a deck, building frontage (e.g., building facade), outdoor architecture, one or more physical objects, one or more outdoor objects, etc.

The identification component 104 can identify portions of the captured 3D data and/or segment the captured 3D data. The identification component 104 can identify flat surfaces (e.g., flat planes, level surfaces, level planes, etc.) associated with the captured 3D data (e.g., mesh data). For example, the identification component 104 can identify at least a portion of the captured 3D data associated with a flat surface. Additionally, the identification component 104 can identify and/or define a boundary associated with a flat surface. The identification component 104 can identify and/or segment at least a portion of the captured 3D data that corresponds to a particular range of sizes and/or a constant (e.g., relatively constant) surface normal as a flat surface. Flat surfaces can be characterized by 2D regions on a plane. Flat surfaces can include walls, floors, and/or ceilings associated with the captured 3D data. In one example, the identification component 104 can identify walls, floors and/or ceilings in captured 3D data by identifying planes within a mesh. Planes that comprise a particular size (e.g., surface area, height, width, etc.) and/or a particular angle (e.g., an angle corresponding to walls, floors, or ceilings) can be identified as walls, floors and/or ceilings (e.g., a flat surface).

Additionally, the identification component 104 can determine that a portion of the captured 3D data (e.g., a section of mesh data) corresponds to a flat surface and/or can further associate the portion of the captured 3D data (e.g., a section of mesh data) with a particular type of flat surface (a wall, a floor or a ceiling). For example, the identification component 104 can initially determine that the portion of the captured 3D data is flat surface (e.g., a wall, a floor or a ceiling). Then, the identification component 104 can determine a type of flat surface based on previously identified portions of the captured 3D data corresponding to flat surfaces and/or information (e.g., size data, orientation data, etc.) associated with previously identified portions of the captured 3D data corresponding to flat surfaces. Additionally, the identification component 104 can identify non-flat surfaces (e.g., curved surfaces, etc.) associated with the captured 3D data (e.g., mesh data). For example, the identification component 104 can modify non-flat surfaces associated with the captured 3D data based on parameterization data to facilitate identification and/or segmentation. In an aspect, the identification component 104 can reclassify (e.g., merge, combine, etc.) an identified flat surface and another identified flat surface based on distance data and/or orientation data associated with the identified flat surface and the other identified flat surface.

Additionally or alternatively, the identification component 104 can segment and/or identify objects (e.g., physical objects) associated with the captured 3D data (e.g., mesh data). For example, the identification component 104 can identify another portion of the captured 3D data associated with an object. Objects can include, but are not limited to, couches, tables, lamps, desks, other furniture, posters, rugs, paintings, other mobile objects, etc. In an aspect, an object can be associated with (e.g., connected to) one or more flat surfaces. As such, the identification component 104 can segment and/or identify objects (e.g., another portion of the captured 3D data associated with an object) based on proximity data in relation to one or more flat surfaces and/or texture data in association with one or more flat surfaces. Additionally or alternatively, the identification component 104 can identify openings (e.g., door openings and/or window openings) associated with identified flat surfaces. For example, the identification component 104 can identify an opening associated with identified flat surfaces based on shape data, location data and/or luminance data of the opening.

The data generation component 106 can identify missing data (e.g., omitted data, a hole, etc.) associated with captured 3D data. Additionally, the data generation component 106 can generate additional data (e.g., 3D data, texture data, etc.) for captured 3D data. For example, a flat surface and/or a non-flat surface associated with the captured 3D data can comprise missing data (e.g., a hole). The data generation component 106 can implement one or more hole-filling techniques to generate additional data (e.g., fill in missing data) associated with captured 3D data. Captured 3D data for an occluded area can be missing when an area on a surface (e.g., a wall, a floor, a ceiling, or another surface) is occluded by an object (e.g., furniture, items on a wall, etc.). Therefore, the data generation component 106 can predict and/or generate data (e.g., geometry data and/or texture data) for a particular surface when an object on the particular surface is moved or removed. The one or more hole-filling techniques can be implemented to generate geometry data and/or texture data for an occluded area.

In an aspect, the data generation component 106 can identify missing data (e.g., a hole) associated with a flat surface and/or a non-flat surface. The data generation component 106 can identify the missing data (e.g., a hole) associated with a surface based on boundary data (e.g., border data) associated with the surface and/or the missing data. For example, the data generation component 106 can identify an edge of a surface that borders an edge of an object. Furthermore, the data generation component 106 can determine that the edge of the surface that borders the edge of the object comprises at least a portion of missing data (e.g., a hole). Additionally or alternatively, the data generation component 106 can identify an edge of a surface associated with a rear portion of an occlusion boundary during a 3D capture process (e.g., when the captured 3D data is captured by one or more 3D sensors). For example, the data generation component 106 can determine whether an object or another surface blocked a portion of a particular surface during a 3D capture process. Furthermore, the data generation component 106 can determine that an edge of the particular surface that was occluded during the 3D capture process is an occlusion boundary.

In another aspect, the data generation component 106 can generate additional 3D data for missing data (e.g., a hole)

associated with a flat surface and/or a non-flat surface. The data generation component 106 can generate additional 3D data for missing data (e.g., a hole) for a surface based on other data (e.g., geometry data and/or texture data) associated with the surface. For example, the data generation component 106 can generate additional 3D data (e.g., triangle mesh data) for missing data (e.g., a hole) associated with a particular surface in response to a determination of edges corresponding to a boundary associated with missing data (e.g., a hole boundary).

Additionally, the data generation component 106 can generate additional 3D data for missing data (e.g., a hole) associated with a surface based on information associated with the missing data (e.g., the hole). For example, the data generation component 106 can generate plane section data and/or triangulated data for missing data (e.g., a hole) in response to a determination that the missing data (e.g., the hole) is approximately flat and located in an interior portion of a particular surface.

The data generation component 106 can replicate captured 3D data located nearby missing data (e.g., a hole). For example, if missing data (e.g., a hole) is located at an edge of particular surface and a portion of the particular surface associated with the missing data (e.g., the hole) was occluded during a 3D capturing process, then the data generation component 106 can extend the edge of the particular surface (e.g., a surface edge) across the missing data (e.g., to supplement the hole). Furthermore, the data generation component 106 can generate additional data for (e.g., fill) an enclosed portion of the missing data (e.g., the hole).

Missing data (e.g., holes) can be associated with more than one surface (e.g., holes may extend across multiple planes). As such, in response to a determination that missing data (e.g., a hole) is associated with more than one surface, the data generation component 106 can extend all surfaces adjacent to the missing data (e.g., based on parameterizations associated with the surfaces adjacent to the missing data) until each of the surfaces adjacent to the missing data intersect. In an aspect, the data generation component 106 can employ a cross section associated with a surface (e.g., a non-planar surface) to generate additional data for missing data (e.g., a hole). The data generation component 106 can identify a cross section by analyzing (e.g., examining) a region around the missing data (e.g., the hole). For example, a non-planar surface (e.g., a column, a structural beam, etc.) can be extruded along a cross section of the non-planar surface to fill in a hole.

Furthermore, the data generation component 106 can generate texture data for additional 3D data generated for missing data (e.g., a hole) associated with a flat surface and/or a non-flat surface. The data generation component 106 can sample a region surrounding missing data (e.g., a hole) via one or more texture synthesis algorithms, including, but not limited to, one or more tiling algorithms, one or more stochastic texture synthesis algorithms, one or more structured texture synthesis algorithms (e.g., one or more single purpose structured texture synthesis algorithms), one or more pixel-based texture synthesis algorithms, one or more patch-based texture synthesis algorithms, one or more fast texture synthesis algorithms (e.g., using tree-structured vector quantization) and/or one or more other texture synthesis algorithms. An appearance of the region surrounding the missing data (e.g., the hole) can be employed to constrain texture synthesis. Textures can be synthesized separately for each surface in response to a determination that missing data (e.g., a hole) is associated with more than one surface. Furthermore, texture for a particular surface can be synthesized onto a portion of the missing data (e.g., the hole) corresponding to the particular surface. In an aspect, normal vectors associated with different portions of missing data (e.g., a hole) and/or a model surround missing data (e.g., a hole) can be employed to select a particular surface (e.g., a texture source) for texture synthesis.

Additionally or alternatively, a weighted average of a color of a surface at a boundary of missing data (e.g., a hole) can be employed to generate texture data. A degree of a weighted average for a particular portion of a surface can be determined based on distance from a boundary of missing data (e.g., a hole). For example, a portion of a surface closer to a boundary of missing data (e.g., a hole) can be weighted more heavily. Additionally or alternatively, an area of a surface associated with missing data (e.g., a hole) can be expanded before textured data is generated for the missing data (e.g., to remove dark areas or shadows surrounding missing data).

In an example, a hole associated with a hole boundary that is within a certain distance from being planar can be filled geometrically by repeatedly connecting pairs of vertices that are two edges apart along the hole boundary to form triangles until the entire hole is triangulated. Visual data from the 3D reconstruction system can then be projected into two dimensions along an axis perpendicular to a determined plane (e.g., a best-fit plane) to the hole. Alternatively, texture data from an area around the hole can be blended according to a weighted average based on distance to provide visual data for the hole (e.g., missing data included in the hole). Alternatively, the texture of the area around the hole can be provided as input into a texture synthesis algorithm to fill in missing data associated with the hole.

The modification component 108 can modify identified and/or segmented data determined by the identification component 104. Additionally, the modification component 108 can modify additional data generated by the data generation component 106. Each flat surface, non-flat surface and/or object identified by the identification component 104 can be uniquely modified by the modification component 108. The modification component 108 can alter one or more surfaces associated with a 3D model and/or one or more objects associated with a 3D model. Geometry data, texture data and/or other data for a surface can be modified by the modification component 108. Furthermore, geometry data, texture data, position data (e.g., location data), presence data (e.g., add or remove), orientation data and/or other data for an object can be modified by the modification component 108. In an aspect, the modification component 108 can modify a surface, an object and/or texture data based on data received via a user interface (e.g., based on user input). In an aspect, the modification component 108 can remove or move a location of a surface and/or an object. In another aspect, the modification component 108 can reclassify a surface and/or an object. For example, an object can be reclassified as one or more surfaces, one or more surfaces can be reclassified as an object, an object and a plurality of surfaces can be reclassified as a different object, etc. As such, the modification component 108 can modify an appearance and/or a classification of one or more surfaces and/or one or more objects.

In an aspect, the modification component 108 can identify one or more portions of a surface and/or an object that comprises a consistent appearance or patterned texture to facilitate modifying a surface and/or an object. The modification component 108 can employ one or more texture segmentation algorithms to identify one or more portions of a surface and/or an object that comprises a consistent appearance or patterned texture. Additionally or alternatively, the modification component 108 can employ one or more appearance/illumination disambiguation algorithms to identify one or more portions of a surface and/or an object that comprise a consistent appearance or patterned texture. One or more portions of a surface and/or an object that comprise a consistent appearance or patterned texture can be employed as a set of areas for an appearance modification and/or a texture modification. Alternately, the modification component 108 can employ an entire surface and/or object to facilitate modifying a surface and/or an object (e.g., an entire surface and/or object can be employed as a set of areas for an appearance modification and/or a texture modification). In another aspect, the modification component 108 can determine illumination data associated with texture data that is applied when modifying texture data. For example, the modification component 108 can identify a pattern of illumination associated with a surface and/or an object once an appearance or texture is identified for a surface and/or an object. The modification component 108 can employ one or more shape/reflectance disambiguation algorithms to identify a pattern of illumination associated with a surface and/or an object. In yet another aspect, the modification component 108 can employ a direct texture replacement technique to directly replace a texture of a surface and/or an object while preserving an identified pattern of illumination. The modification component 108 can generate an updated 3D model in response to modifying one or more surfaces and/or one or more objects in a 3D model. In an embodiment, modifications can be chosen (e.g., selected) by a user via a user interface. Furthermore, a user can select a portion of a 3D model via a user interface. For example, a user can select an object, a surface, an area of consistent appearance or texture and/or another portion of a 3D model via a user interface. Additionally or alternatively, a user can choose a new texture for the selected portion of the 3D model via the user interface.

The identification component 104, the data generation component 106 and/or the modification component 108 can output processed 3D data (e.g., PROCESSED 3D DATA shown in FIG. 1). For example, the processed 3D data can include captured 3D data that is identified, segmented, augmented and/or modified. The processed 3D data can facilitate generation of a 3D model and/or a floorplan associated with the captured 3D data.

While FIG. 1 depicts separate components in system 100, it is to be appreciated that the components may be implemented in a common component. In one example, the identification component 104, the data generation component 106 and/or the modification component 108 can be included in a single component. Further, it can be appreciated that the design of system 100 can include other component selections, component placements, etc., to facilitate processing (e.g., identifying, segmenting, augmenting and/or modifying) 3D data.

Figure 2:
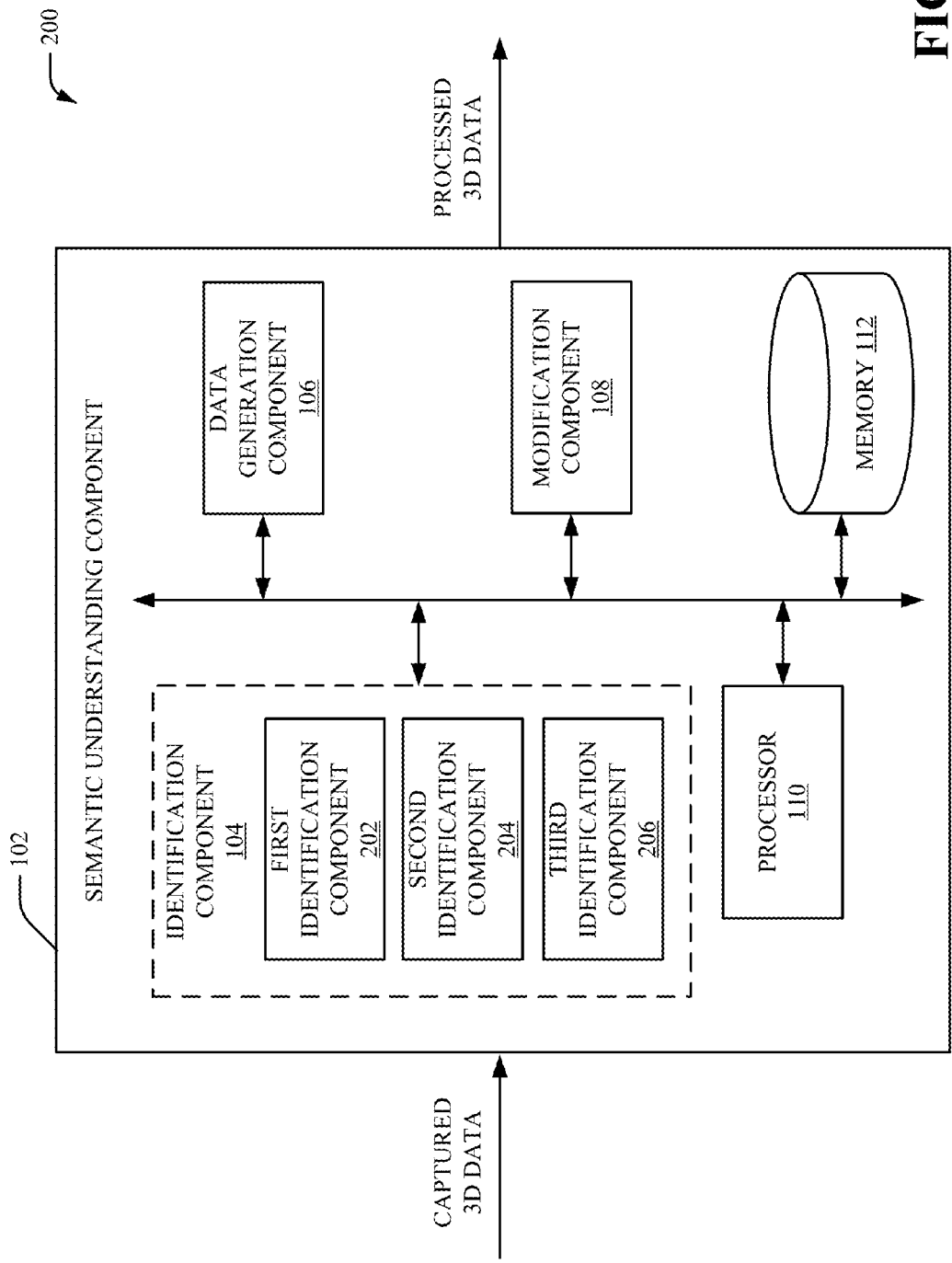
FIG. 2 illustrates a high-level block diagram of another example semantic understanding component for processing 3D data, in accordance with various aspects and implementations described herein.

Referring to FIG. 2, there is illustrated a non-limiting implementation of a system 200 in accordance with various aspects and implementations of this disclosure. The system 200 includes the semantic understanding component 102. The semantic understanding component 102 can include the identification component 104, the data generation component 106 and/or the modification component 108. The identification component 104 can include a first identification component 202, a second identification component 204 and/or a third identification component 206. In an aspect, the first identification component 202 can be implemented as a surface identification component, the second identification component 204 can be implemented as an object identification component and/or the third identification component 206 can be implemented as an architectural opening identification component.

The first identification component 202 can identify surfaces (e.g., flat surfaces and/or non-flat surfaces) associated with captured 3D data. In an aspect, the first identification component 202 can identify flat surfaces (e.g., walls, floors and/or ceilings) in captured 3D data based on an iterative method such as, for example, RANdom SAmple Consensus (RANSAC). For example, the first identification component 202 can select a certain surface area and/or a certain number of edges, vertices, or triangles that are associated with a common plane. The first identification component 202 can also identify other points, vertices, or triangles that are also associated with the common plane. As such, the first identification component 202 can determine that a common plane is a surface (e.g., a wall, floor or ceiling) in response to a determination that a certain surface area or a certain number of edges, vertices, or triangles are associated with the common plane. Furthermore, the first identification component 202 can remove geometry associated with the common plane from a set of geometry being considered for identification. The first identification component 202 can repeat this process to identify other planes (e.g., other walls, floor or ceilings) in captured 3D data. Additionally or alternatively, the first identification component 202 can identify flat surfaces (e.g., walls, floors and/or ceilings) in captured 3D data based on a non-iterative method.

The first identification component 202 can additionally determine an estimate of a surface fit associated with a particular portion of the captured 3D data. Based on the surface fit associated with the particular portion of the captured 3D data, the first identification component 202 can identify a greater portion of the captured 3D data (e.g., the first identification component 202 can implement a region growing technique). For example, the first identification component 202 can add other portions of the captured 3D data associated with the particular portion of the captured 3D data (e.g., neighboring portions of data) based on a criteria, such as but not limited to, an orientation of another portion of the captured 3D data being close to an orientation of the estimate of the surface fit associated with the particular portion of the captured 3D data, a normal vector of another portion of the captured 3D data being close to a normal vector of the estimate of the surface fit associated with the particular portion of the captured 3D data, the distance from another portion of the captured 3D data to the particular portion of the captured 3D data being under a threshold level, etc. The first identification component 202 can reject other portions of captured 3D data if the other portions of the captured 3D data are determined to not fit (e.g., sufficiently fit) the plane. Furthermore, the first identification component 202 can update a surface model (e.g., a least-squares fit or a covariance matrix) as other portions of the captured 3D data (e.g., new portions of the captured 3D data) are identified as belonging to a corresponding surface (e.g., the same surface).

In an embodiment, the first identification component 202 can reclassify (e.g., merge, combine, etc.) portions of the captured 3D data (e.g., captured regions of a 3D model) that are identified as flat surfaces. For example, the first identification component 202 can reclassify (e.g., merge, combine, etc.) portions of the captured 3D data that are identified as flat surfaces based on distance criteria and/or orientation criteria. Distance criteria can include, but are not limited to, a determination that portions of the captured 3D data that are identified as flat surfaces overlap, that portions of the captured 3D data that are identified as flat surfaces are contiguous (e.g., connected, touching, etc.), that distance between an edge of a particular portion of the captured 3D data and an edge of another portion of the captured 3D data is below a threshold level, etc. Orientation criteria can include, but are not limited to, a determination that orientation and/or normal vectors of portions of the captured 3D data differ by less than a certain threshold level, that a mean-squared error of a surface fit to a particular portion of the captured 3D data and another portion of the captured 3D data is less than a certain threshold level, etc. In an aspect, the first identification component 202 reclassifies (e.g., merges, combines, etc.) portions of the captured 3D data that are identified as flat surfaces in response to a determination that the portions of the captured 3D data are associated with a common subsection of a 3D model (e.g., a common room), and does not reclassify portions of the captured 3D data that are identified as flat surfaces in response to a determination that the portions of the captured 3D data are not associated with a common subsection of a 3D model. The first identification component 202 can implement one or more room-segmentation algorithms to determine whether portions of the captured 3D data are associated with a common subsection of a 3D model (e.g., a common room). In one example, a subsection (e.g., a room, a cell, etc.) can be identified based on a cell and portal method (e.g., a volumetric cell and portal method, portal culling, etc.). For example, a volumetric representation of a 3D model can be employed to facilitate identifying subsections (e.g., rooms, cells, etc.) in the 3D model. Objects in the 3D model to separate can correspond to cells and separators in the 3D model can correspond to portals. In another aspect, the first identification component 202 can measure distance (e.g., distance between an edge of a particular portion of the captured 3D data and an edge of another portion of the captured 3D data) along a surface of a mesh. As such, merging ceilings of two adjacent, but different, subsections of a 3D model (e.g., two adjacent rooms of a 3D model) can be avoided, while merging two adjacent, but common, subsections of a 3D model (e.g., two sections of a ceiling of a single room separated by a crossbeam) can be accomplished.

The first identification component 202 can identify and/or segment (e.g., automatically identify and/or automatically segment) flat surfaces in captured 3D data based on boundaries associated with subsections of a 3D model (e.g., room boundaries). Boundaries associated with subsections of a 3D model (e.g., room boundaries) can be automatically determined by the first identification component 202 or manually determined (e.g., based on user input).

A flat surface identified by the first identification component 202 can comprise a plane and/or plane boundaries associated with the plane. The first identification component 202 can determine plane boundaries by tracking (e.g., tracing) outer edges of a portion of a 3D model identified as a flat surface (e.g., outer edges of a "flat surface" region). In certain instances, outer edges of a flat surface can be uneven (e.g., irregular, jagged, etc.). For example, a flat surface identified by the first identification component 202 can comprise at least one uneven boundary line (e.g., irregular boundary line, jagged boundary line, etc.). As such, the first identification component 202 can smooth and/or segment plane boundaries (e.g., boundary lines). For example, if the first identification component 202 determines that a portion of a plane boundary (e.g., an uneven boundary line) is approximately a straight line (e.g., via a determination that a standard deviation of a least-squares fit to the 3D boundary is below a particular threshold level, via a determination that a maximum deviation of a least-squares fit to the 3D boundary is below a particular threshold level, etc.), the first identification component 202 can replace the portion of the plane boundary with a straight line. Accordingly, the first identification component 202 can convert a set of jagged lines associated with a plane boundary into a plurality of straight lines that correspond to a boundary of a best-fit plane.

In an aspect, the first identification component 202 can employ visual appearance information (e.g., brightness, color, texture, etc.) associated with captured 3D data to determine and/or refine a plane boundary associated with a plane. In one example, the first identification component 202 can employ one or more edge detection algorithms (e.g., a canny edge detector algorithm, etc.) to determine edges (e.g. potential edges) for identified surfaces. Additionally, the first identification component 202 can detect straight lines associated with edge detection results (e.g., by employing a Hough transform for a surface or edge, etc.). The first identification component 202 can employ detected edges and/or straight lines determined based on detected edges to select and/or refine surface boundaries. The first identification component 202 can also associate a detected visual edge with an edge of an identified surface in response to a determination that the edge of the identified surface is near (e.g., within a certain distance from) the detected visual edge. Moreover, the first identification component 202 can add, move, re-segment and/or remove portions of mesh data from a segmented surface so that a boundary more closely matches a nearby detected visual edge.

The first identification component 202 can evaluate portions of the captured 3D data for inclusion in multiple candidate planes. For example, the first identification component 202 can employ a scoring function to evaluate portions of the captured 3D data for inclusion in multiple candidate planes. The scoring function can be determined based on position data and/or orientation data for a portion of 3D data relative to a candidate plane. In an aspect, the first identification component 202 can employ an intersection line of planes from two identified surfaces of different orientations as a boundary for each identified plane. Furthermore, the first identification component 202 can employ an intersection line of planes from two identified surfaces of different orientations (e.g., a boundary for each identified plane) to modify (e.g., refine) one or more edges of the plane.

In an embodiment, the first identification component 202 can identify non-flat surfaces (e.g., curved surfaces) associated with the captured 3D data (e.g., mesh data). A non-flat surface (e.g., a curved surface) can include, but is not limited to, a cylinder, a sphere, etc. The first identification component 202 can employ a parameterization associated with a non-flat surface (e.g., a curved surface) to fit a curved surface to the 3D model. Additionally, the first identification component 202 can employ a parameterization associated with a non-flat surface to identify and/or segment a non-flat surface as described above with regard to a flat surface.

In another embodiment, the first identification component 202 can modify parameters for identifying and/or segmenting planar regions (e.g., relax parameters for identifying and/or segmenting planar regions) to identify additional surfaces associated with the captured 3D data. As such, identification of surfaces associated with bumpy surfaces (e.g., brick walls) can be improved. The first identification component 202 can identify and/or segment an additional surface associated with the captured 3D data as a flat surface in response to a determination that the additional surface associated with the captured 3D data satisfies one or more criteria, such as but not limited to, that an orientation of the additional surface is within a certain range from an expected room surface (e.g., a vertical wall, a horizontal floor, a ceiling, etc.), that the additional surface satisfies a particular size, that the additional surface shares a certain number of boundaries with one or more identified surfaces, that the additional surface completes (e.g., substantially completes) a surface boundary of an identified room, etc.

Additionally, the first identification component 202 can associate an identified flat surface and/or an identified non-flat surface with a particular identifier and/or a particular score. For example, an identified flat surface can be assigned an identifier value associated with a wall, an identifier value associated with a floor, or an identifier value associated with a ceiling based on a calculated score. The first identification component 202 can assign an identifier value to an identified flat surface based on one or more criteria. For example, an identified flat surface can be assigned an identifier associated with a wall in response to a determination that a normal vector associated with the identified flat surface is approximately horizontal, that a size (e.g., a surface area, etc.) of the identified flat surface satisfies a particular threshold level, that a height associated with the identified flat surface satisfies a particular threshold level, that a bottom boundary of the identified flat surface corresponds to (e.g., matches) a height or boundary of an identified floor, that the identified flat surface correspond to a size and near-opposite orientation of an identified wall, etc. In another example, an identified flat surface can be assigned an identifier associated with a floor in response to a determination that a normal vector associated with the identified flat surface is approximately vertical, that a size (e.g., a surface area, etc.) of the identified flat surface satisfies a particular threshold level, that the identified flat surface is associated with a lowest average height with respect to other identified near-horizontal planes in an identified room and/or a 3D model, that the identified flat surface correspond to a size and near-opposite orientation of an identified ceiling, etc. In yet another example, an identified surface can be assigned an identifier associated with a ceiling in response to a determination that a normal vector associated with the identified surface is pointed in a range of downward directions, that a size (e.g., a surface area, etc.) of the identified surface satisfies a particular threshold level, that a boundary of the identified surface corresponds to (e.g., matches) a boundary of an identified wall, that an identified surface forms part of an outer shell of an identified room, that an identified surface forms part of a convex hull surrounding an identified room, that an identified surface forms part of a surface that is associated with a certain amount of (e.g., a small amount of) or no captured 3D data in a particular region (e.g., a region associated with a particular size) behind the identified surface, that the identified surface correspond to a size and near-opposite orientation of an identified floor, etc. In an aspect, a largest unidentified plane in a given room and/or in an entire 3D model can be iteratively identified as a wall, floor or ceiling (e.g., a surface) until a certain threshold associated with an enclosing of a captured volume is reached.

The second identification component 204 can identify one or more objects attached to an identified surface (e.g., a surface that is identified by the first identification component 202). For example, the second identification component 204 can identify flat objects (e.g., posters, rugs, etc.) and/or other objects (e.g., paintings, furniture) connected to an identified flat surface (e.g., a wall, a floor or a ceiling). Furthermore, the second identification component 204 can disconnect (e.g., segment out, disassociate, etc.) identified flat objects and/or other identified objects from an identified flat surface. As such, the appearance of an identified flat surface can be modified without affecting the appearance of identified flat objects and/or other identified objects. Furthermore, identified flat objects and/or other identified objects can be removed (e.g., deleted, moved, etc.) from captured 3D data.

The second identification component 204 can also identify and/or segment objects that are not associated with (e.g., a part of) a mesh identified as a surface. For example, after the first identification component 202 identifies one or more surfaces, the second identification component 204 can identify one or more objects (e.g., connected components) associated with captured 3D data that are not identified as the one or more surfaces. The second identification component 204 can combine multiple objects that comprise sections of boundaries within a certain distance. Furthermore, the second identification component 204 can assign an identifier (e.g., a label, a tag, etc.) to an object that identifies one or more particular flat surfaces (e.g., a wall, a floor, a ceiling) associated with the object. For example, the second identification component 204 can assign an identifier to an object that identifies a particular flat surface associated with the object based on a determination that the object and the particular flat surface are contiguous (e.g., connected, touching, etc.), that distance between boundaries of the object and the particular flat surface are within a certain distance, etc. Examples of an object attached to a particular flat surface include, but are not limited to, a table attached to a floor, a painting attached to a wall, a bookcase attached to a floor and a wall, etc.

A particular portion of captured 3D data (e.g., a section of a 3D model) that corresponds to an object and/or a surface can be refined once the object and/or the surface are segmented. The second identification component 204 can implement one or more algorithms for refining surface boundaries and/or determining whether a portion of mesh data corresponds to a particular surface. In an aspect, the second identification component 204 can reclassify a flat surface as corresponding to an object based on an evaluation of one or more characteristics associated with the flat surface. For example, the second identification component 204 can reclassify a flat surface as corresponding to an object in response to a determination that a size of the flat surface (e.g., a surface area of the flat surface) is below a threshold level, that the flat surface does not correspond to an outer shell and/or a convex hull of an identified room, and/or that a visual appearance of the flat surface (e.g., a hue, a texture, etc.) matches an object, etc.

Additionally or alternatively, the second identification component 204 can identify and/or segment objects that are associated with (e.g., a part of) a mesh identified as a surface. In one example, mouldings on a wall can be identified and/or segmented. The second identification component 204 can employ one or more image segmentation algorithms and/or one or more texture segmentation algorithms to identify different portions (e.g., different regions) of captured 3D data. In one example, the one or more image segmentation algorithms and/or the one or more texture segmentation algorithms can be employed on 2D images. For example, a 2D image can be partitioned into regions of brightness and/or regions of texture (e.g., by analyzing the 2D image based on brightness, contour and/or texture). In an aspect, similarity between pixels of the 2D image can be measured based on contour (e.g., brightness contour). In another aspect, filter responses that that represent textures can be grouped into a set of response vectors. As such, a surface appearance of an identified surface can be projected to 2D for further processing and/or analyzing.

Alternatively, a texture segmentation algorithm can be employed on a UV texture map for locating and/or segmenting objects that are associated with an identified surface (e.g., a mesh identified as a surface). In connection with employing a texture segmentation algorithm, the second identification component 204 can identify a largest portion (e.g., a largest region) of captured 3D data. Furthermore, the second identification component 204 can assign an appearance of the largest portion of captured 3D data to the surface (e.g., the largest portion of the captured 3D data can be identified as a native appearance of the surface). The second identification component 204 can merge remaining portions (e.g., regions) of captured 3D data into single objects in response to a determination that remaining portions of captured 3D data are contiguous. Furthermore, the second identification component 204 can re-merge regions into a main region corresponding to the largest portion in response to a determination that certain characteristics are satisfied. For example, the second identification component 204 can re-merge regions into a main region in response to a determination that a size (e.g., a surface area) of the regions is below a certain threshold level, that an appearance of the regions corresponds to (e.g., closely matches) an appearance of the main region, etc. In an aspect, the second identification component 204 can determine that changes in surface normal or deviation from a plane fitted to a surface may correspond to a boundary of a thin object. The second identification component 204 can employ a boundary of a thin object to identify objects on the surface. Furthermore, once an object is identified on the surface, the second identification component 204 can segment and/or remove a corresponding portion of the surface. In another embodiment, the first identification component 202 and/or the second identification component 204 can employ object classification techniques in 2D captured images and/or unsegmented captured 3D data. As such, the second identification component 204 can tag data points in 2D captured images and/or unsegmented captured 3D data that are associated with objects (e.g., chairs, tables, etc). The first identification component 202 can analyze remaining unsegmented captured 3D data for planes, floors, walls, ceilings, etc.

In an aspect, the second identification component 204 can generate object relation data (e.g., information such as that a bookshelf "is on" a wall and a floor, that a table "is on" a floor) to constrain and/or associate available positions of surfaces and/or objects. For example, the second identification component 204 can determine a set of relations of ownership for surfaces and/or objects. The second identification component 204 can generate object relation identifiers for surfaces and/or objects (e.g., object-relational notions of "touches", "contains", and "is on", etc.). For example, the second identification component 204 can generate a first object relation identifier "touch" for adjacent surfaces and/or objects that share an edge, a second object relation identifier "contain" for a room that includes walls, floors, and/or objects, a third object relation identifier "is on" for an object that is on a flat plane (or a window that is on a wall, or a bookshelf that is on a floor and a wall, etc.), a fourth object relation identifier "fixed" for a fixed object (e.g., a fireplace), a fifth object relation identifier "movable" for a movable object (e.g., a chair), etc. The second identification component 204 can determine an object relation identifier based on position data and/or proximity of mesh data associated with surfaces and/or objects. In one example, the second identification component 204 can transform object relation data into particular data formats (e.g., building information management formats, computer-aided design formats, etc.). In an embodiment, object relation data can be manually indicated and/or corrected by a user (e.g., via a user interface).

In another aspect, the second identification component 204 can separate a first object and a second object that are contiguous. For example, an object can comprise a first object and a second object that are contiguous. The second identification component 204 can separate an object (e.g., identify a first object and a second object that form the object) based on shape data, texture data and/or color data (e.g., texture differences and/or color differences), by comparing the first object and/or the second object to a database of predetermined objects, by identifying vertical divisions that separate the first object and the second object, by identifying narrow regions in the object, etc. Additionally or alternatively, the second identification component 204 can group similar objects (e.g., identical objects) into a common object. For example, track lights or a series of beams in a ceiling can be grouped to form a common object. The second identification component 204 can determine whether to group nearby objects by aligning the nearby objects (e.g., aligning nearby objects to one another to determine similarity), determining an amount of overlap (e.g., a percentage of overlap), determining similarity of color, determining whether similar objects are repeated objects, etc.

In yet another aspect, the data generation component 106 can generate additional data (e.g., 3D data, texture data, etc.) for missing data (e.g., holes) based on an understanding of objects associated with (e.g., located nearby) missing data. For example, the first identification component 202 and/or the second identification component 204 can identify a moulding as an object of fixed width between two planes or at a boundary of a plane associated with a portal (e.g., a door opening) or a window opening. Walls and/or floors can be extended behind a moulding to intersect with a portal or with one another. As such, the data generation component 106 can extend a moulding so that missing data (e.g., a hole) that borders a moulding can be filled (e.g., partially filled) by additional data.

The third identification component 206 can identify captured 3D data associated with architectural openings of a flat surface based at least in part on information (e.g., flat surface data) determined by the first identification component 202. For example, the third identification component 206 can identify portals (e.g., door openings) and/or window openings associated with flat surfaces identified by the first identification component 202. A portal (e.g., a door opening) can be an opening in a particular flat plane (e.g., a wall) that connects multiple subsections (e.g., rooms) of a 3D model. A portal can be defined by a flat surface for each side of the portal. The boundaries of the flat surface for each side of the portal can correspond to a location where the portal intersects the flat surface of each of two walls.

A portal (e.g., a door opening) or window opening can be detected by analyzing a boundary of an identified flat surface in a 3D model (e.g., a wall). Portions of the boundary of the identified flat surface that fall mostly or entirely within an interior of the identified flat surface (e.g., not on a convex hull of the identified flat surface) can be candidate boundaries for portals or window openings. As such, candidate portals and/or candidate window openings can be determined based on the portions of the boundary of the identified flat surface that fall mostly or entirely within the interior of the identified flat surface. Shapes associated with candidate portals and/or candidate window openings can be analyzed using one or more other techniques to determine a final classification (e.g., a final classification for candidate portals and/or candidate window openings) and/or a determination of boundaries. For example, size and/or shape of candidate portals and/or candidate window openings can be considered. Additionally or alternatively, one or more other techniques can be employed. Furthermore, a perimeter formed by intersecting a 3D model with a detected division between subsections of the 3D model (e.g., rooms) can be employed to generate candidate boundaries for portals and/or window openings.

The third identification component 206 can employ predetermined information associated with a portal to identify a portal. For example, a portal generally comprises a rectangular shape (e.g., a portal can be a rectangular opening). Thus, portal boundaries can typically be represented by four corners. Moreover, portal boundaries generally extend from a bottom boundary of a floor to more than a certain height (e.g., six feet in height). However, different heights for a bottom or top of a portal may be possible. Therefore, the third identification component 206 can identify an architectural opening of a flat surface as a portal in response to a determination that a height of the architectural opening is greater than a threshold level (e.g., a certain height). In one example, the third identification component 206 can compare a size of an architectural opening against a database of common door sizes to determine whether an architectural opening of a flat surface is a portal. In an aspect, the third identification component 206 can associate captured 3D data related to a closed door with a particular 2D shape. As such, the third identification component 206 can compare a size of the particular 2D shape against a database of common door sizes to determine whether the particular 2D shape is a portal. Furthermore, a portal can be rounded, rectangular, pill shaped, an oval, or another type of shape. Additionally, a portal is generally surrounded by a flat surface associated with a wall. Therefore, additionally or alternatively, the third identification component 206 can identify an architectural opening of a flat surface as a portal in response to a determination that a shape of the architectural opening corresponds to a shape included in a set of shapes (e.g., as set of predetermined shapes). In one example, a surface of a flat plane associated with a wall can comprise a portal. In another example, a portal can be separate from a surface of a flat plane associated with a wall. Therefore, additionally or alternatively, the third identification component 206 can identify an architectural opening of a flat surface as a portal based on other data associated with the flat surface.

A window opening can be an opening in a particular flat plane (e.g., a wall) that connects a subsection (e.g., a room) of a 3D model to an area outside captured 3D data and/or outside a captured room associated with captured 3D data. Additionally, a window can be an opening in a particular flat plane (e.g., a wall) that connects two subsections (e.g., two rooms) of a 3D model. The third identification component 206 can employ predetermined information associated with a window opening to identify a window opening. For example, a window opening generally comprises a height that is less than a portal. Moreover, a window opening generally comprises a lower boundary (e.g., a bottom boundary) that is above (e.g., significantly above) a height of a nearest flat plane associated with a floor. Therefore, the third identification component 206 can identify an architectural opening of a flat surface as a window opening in response to a determination that a height of a bottom of the architectural opening is greater than a threshold level. Furthermore, a window opening can be represented by a region on a 2D surface. Window openings generally comprise a rectangular shape (e.g., a window can be a rectangular opening) corresponding to a location where the window opening penetrates a flat surface (e.g., a wall). Therefore, additionally or alternatively, the third identification component 206 can identify an architectural opening of a flat surface as a window opening in response to a determination that a shape of the architectural opening corresponds to a shape included in a set of shapes (e.g., as set of predetermined shapes).

In addition, window openings generally comprise a particular depth to which the window opening penetrates a flat surface (e.g., a wall). Also, a window opening can be associated with partially or fully transparent material. Additionally, a window opening is generally surrounded by a flat surface associated with a wall. In one example, a surface of a flat surface associated a wall can comprise a window opening. In another example, a window opening can be separate from a surface of a flat surface associated a wall. Therefore, additionally or alternatively, the third identification component 206 can identify an architectural opening of a flat surface as a window opening based on other data associated with the flat surface (e.g., lower boundary data, depth data, transparency data, texture data, luminance data, timestamp data, and/or other data associated with an architectural opening of the flat surface). In an aspect, a window opening associated with closed blinds can be identified based on predetermined textures and/or shapes of blinds or curtains via a scene segmentation algorithm, a texture classification algorithm and/or another algorithm. In another aspect, a rectangular region that comprises certain luminance levels (e.g., light levels) during a particular time of data capture (e.g., daytime) can be identified as a window opening.

The third identification component 206 can employ one or more identification algorithms to distinguish between a portal and a window opening. However, the third identification component 206 can additionally or alternatively distinguish between a portal and a window opening based on manual input (e.g., input provided by a user). In an aspect, the third identification component 206 can employ a score associated with an architectural opening of a flat surface to determine whether the architectural opening is a portal or a window opening. In another aspect, the third identification component 206 can determine that a pair of adjacent flat surfaces associated with a wall (e.g., two adjacent flat surfaces that comprise opposing normal vectors facing in opposite directions) comprising an architectural opening is a portal or a window opening.

While FIG. 2 depicts separate components in system 200, it is to be appreciated that the components may be implemented in a common component. In one example, the first identification component 202, the second identification component 204 and/or the third identification component 206 can be included in a single component. Further, it can be appreciated that the design of system 200 can include other component selections, component placements, etc., to facilitate processing (e.g., identifying, segmenting, augmenting and/or modifying) 3D data.

Figure 3:
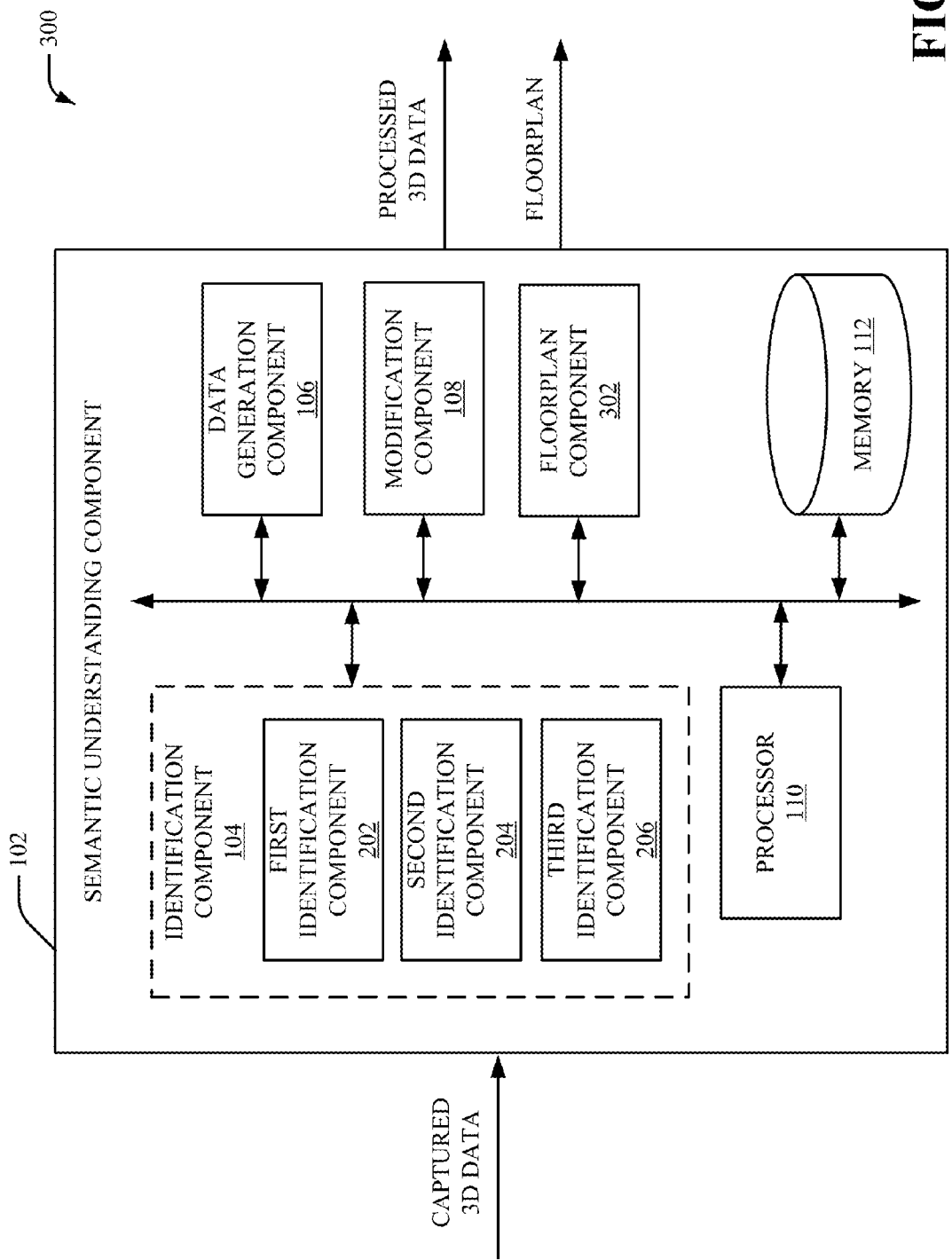
FIG. 3 illustrates a high-level block diagram of yet another example semantic understanding component for processing 3D data, in accordance with various aspects and implementations described herein.

Referring to FIG. 3, there is illustrated a non-limiting implementation of a system 300 in accordance with various aspects and implementations of this disclosure. The system 300 includes the semantic understanding component 102. The semantic understanding component 102 can include the identification component 104, the data generation component 106, the modification component 108 and/or a floorplan component 302. The identification component 104 can include the first identification component 202, the second identification component 204 and/or the third identification component 206.

The floorplan component 302 can generate a floorplan (e.g., FLOORPLAN shown in FIG. 3) based on 3D data processed by the identification component 104 (e.g., the first identification component 202, the second identification component 204 and/or the third identification component 206), the data generation component 106 and/or the modification component 108. A floorplan (e.g., a floorplan model) can be a simplified representation of surfaces (e.g., walls, floors, ceilings, etc.), portals (e.g., door openings) and/or window openings associated with an interior environment (e.g., captured 3D data for a 3D model). A floorplan can contain locations of boundary edges for each given surface, portal (e.g., door opening), and/or window opening. A floorplan can include one or more objects. Alternatively, a floorplan can be generated without objects (e.g., objects can be omitted from a floorplan). A floorplan can include one or more dimensions associated with surfaces (e.g., walls, floors, ceilings, etc.), portals (e.g., door openings) and/or window openings. In an aspect, dimensions under a certain size can be omitted from a floorplan. Planes included in a floorplan can be extended a certain distance (e.g., to intersect past a moulding).

A floorplan generated by the floorplan component 302 can be a schematic floorplan of an architectural structure (e.g., house), a schematic floorplan of an interior space of an architectural structure (e.g., a house), etc. In an example, a floorplan generated by the floorplan component 302 can be generated (e.g., automatically generated) by employing identified walls associated with captured 3D data. In yet another example, a floorplan generated by the floorplan component 302 can employ common architectural notation to illustrate architectural features of an architectural structure (e.g., doors, windows, fireplaces, length of walls, other features of a building, etc.). A floorplan generated by the floorplan component 302 can comprise a series of lines in 3D space which represent intersections of walls and/or floors, outlines of doorways and/or windows, edges of steps, outlines of other objects of interest (e.g., mirrors, paintings, fireplaces, etc.). Furthermore, a floorplan generated by the floorplan component 302 can also comprise measurements for walls and/or other common annotations which appear in architectural floorplans. In an aspect, the series of lines can be rendered with brightness that varies based on distance of each part of a particular line from a viewpoint (e.g., to give an improved sense of depth when viewing 3D data).

In an aspect, a floorplan generated by the floorplan component 302 can be a 3D floorplan. A 3D floorplan can comprise edges of each floor, wall, and ceiling as lines. Lines for floors, walls and ceilings can be dimensioned (e.g., annotated) with an associated size. A 3D floorplan can be navigated via a viewer on a remote device in 3D. In an aspect, subsections of the 3D floorplan (e.g., rooms) can be associated with a textual data (e.g., a name). In another aspect, measurement data associated with surfaces (e.g., as calculated by the floorplan component 302) can be displayed on a floorplan generated by the floorplan component 302. For example, measurements of area (e.g., square footage, etc.) of surfaces and/or other types of measurement data can be displayed in connection with a floorplan generated by the floorplan component 302. Calculation of area (e.g., square footage) can be determined for any identified surface or portion of a 3D model with a known boundary, for example, by summing areas of polygons comprising the identified surface or the portion of the 3D model. Displays of individual items (e.g., dimensions) and/or classes of items can be toggled in a floorplan via a viewer on a remote device (e.g., via a user interface on a remote client device). In another aspect, a floorplan generated by the floorplan component 302 can be a 2D floorplan. For example, surfaces (e.g., walls, floors, ceilings, etc.), portals (e.g., door openings) and/or window openings associated with captured 3D data for a 3D model can be projected to a flat 2D surface. In yet another aspect, a floorplan can be viewed at a plurality of different heights with respect to vertical surfaces (e.g., walls) via a viewer on a remote device.

Figure 4:
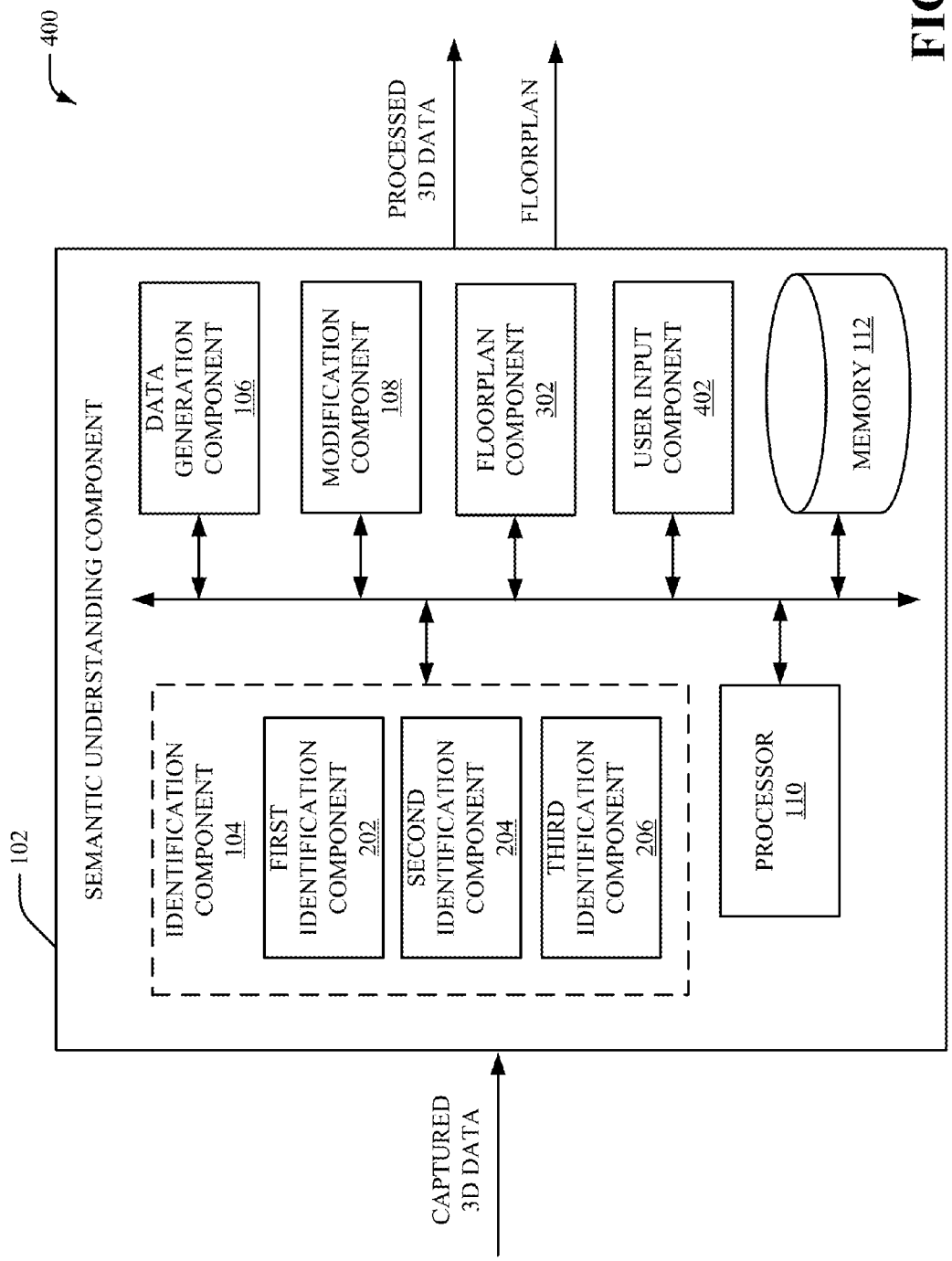
FIG. 4 illustrates a high-level block diagram of yet another example semantic understanding component for processing 3D data, in accordance with various aspects and implementations described herein.

Referring to FIG. 4, there is illustrated a non-limiting implementation of a system 400 in accordance with various aspects and implementations of this disclosure. The system 400 includes the semantic understanding component 102. The semantic understanding component 102 can include the identification component 104, the data generation component 106, the modification component 108, the floorplan component 302 and/or a user input component 402. The identification component 104 can include the first identification component 202, the second identification component 204 and/or the third identification component 206.

The user input component 402 can receive input (e.g., data, commands, etc.) associated with a user (e.g., a user identity). The user input component 402 can be associated with (e.g., implemented in connection with) a user interface for receiving input associated with a user. Additionally the user input component 402 can modify (e.g., alter, manipulate, etc.) one or more surfaces and/or one or more objects associated with a 3D model and/or a floorplan schematic based on input associated with a user.

In an aspect, the user input component 402 can receive a modification instruction for a surface and/or an object. The modification component 108 and/or the user input component 402 can modify an appearance, orientation and/or grouping of one or more surfaces and/or one or more objects based on input (e.g., data) associated with a user. For example, a user (e.g., a user identity) can identify a new color and/or a new texture for one or more surfaces and/or one or more objects. In an aspect, a user (e.g., a user identity) can identify a new color and/or a new texture for one or more surfaces and/or one or more objects based on a catalog of available paint colors, wallpapers, flooring options, etc. A new color and/or a new texture received via the user input component 402 can be applied to corresponding surfaces and/or objects. In an aspect, illumination associated with a surface and/or an object can be reapplied to the new color and/or new texture for the surface and/or object (e.g., to match a known ambient illumination and/or shadows). For example, when an existing object is moved, when an existing object or surface is recolored or retextured, or when a new object is added to a 3D model, illumination can be applied to the object based on known illumination of the 3D model. In another example, if an existing object is moved in the 3D model, derived variations in ambient illumination can be removed. Illumination of a 3D model can be derived from an environment map at a corresponding location (e.g., a detected or derived directional variation of illumination at a given location based on luminance data and/or color data can be employed to generate a 3D model) and/or identified sources of light (e.g., windows, overhead lights, etc.) can be employed as sources of directed illumination. Additionally or alternatively, illumination can be incorporated in texture data for a surface and/or object. Additionally or alternatively, illumination can be applied during a rendering process via directional illumination. Alternately, a direct texture replacement technique (e.g., texture analysis and/or manipulation) can be employed to directly replace textures of one or more segments while preserving illumination. For example, geometric and/or lighting patterns associated with one or more segments can be applied to the new texture for the one or more segments.

In another aspect, the user input component 402 can receive a reclassification of a surface and/or an object. The modification component 108 and/or the user input component 402 can reclassify a surface and/or an object based on reclassification data received by the user input component 402. A reclassification received via the user input component 402 can include, but is not limited to, a reclassification of an object as one or more surfaces, a reclassification one or more surfaces as an object, a reclassification of an object and a plurality of surfaces as a different object, etc. As such, a user (e.g., a user identity) can highlight a surface and/or an object, alter a classification of a surface and/or an object, alter object-relational attributes (e.g., object relation data) of a surface and/or an object, group surfaces and/or objects together, disassociate a grouping of surfaces and/or objects, etc.

In yet another aspect, one or more surfaces and/or one or more objects can be identified by a user (e.g., a user identity). Additionally or alternatively, a group of surfaces and/or objects can be identified by a user (e.g., a user identity). Additionally or alternatively, all examples of a particular class of surfaces and/or objects (e.g., all floors, etc.) can be identified by a user (e.g., a user identity). The user input component 402 can receive an identifier for one or more surfaces and/or one or more objects that are identified by a user (e.g., a user identity). In yet another aspect, texture data for one or more surfaces and/or one or more objects can be identified by a user (e.g., a user identity). For example, a user can define a region of a surface and/or an object for texture inclusion or texture exclusion. In yet another aspect, surfaces and/or objects can be selected moved, rotated, duplicated and/or removed by a user via the user input component 402. The modification component 108 can employ information received via the user input component 402 to generate an updated 3D model. In an embodiment, new 3D objects from an external database can be added to a 3D model by a user via the user input component 402. New objects can comprise categorical information (e.g., "table", etc.) that can be employed by the second identification component 204 to generate object-relational constraints during placement and/or movement (e.g., a table "is on" the floor) of new objects.

In an embodiment, the user input component 402 can calculate a measurement of area (e.g., square footage, etc.), an amount of paint/flooring required, a total cost, etc. associated with a 3D model and/or a floorplan. A number of surfaces to be repainted or re-floored can be chosen by a user (e.g., a user identity) via the user input component 402. Boundaries of a surface can be employed to calculate a surface area. Surface area can be employed to calculate a required amount of paint via a particular formula (e.g., a given volume of paint per unit of surface area). Cost can be calculated by querying a database of prices given a required amount of material. Amounts of wallpaper or flooring required can be calculated via a layout system that searches for an optimal layout of material given constraints for material production sizes, desired orientation of the applied material, placement of seams, etc. Information associated with size and/or shape of a surface can be employed to pre-cut material.

In an embodiment, one or more features of the user input component 402 can be associated with and/or implemented on a remote client device. In another embodiment, the user input component 402 can receive input data (e.g., modification data, reclassification data, identification data, etc.) from a remote client device. In yet another embodiment, the user input component 402 and the modification component 108 can be implemented as a single component. The user input component 402 can employ and/or be associated with a graphical user interface to allow a user to interact with 3D data. The graphical user interface can comprise a 3D rendering of 3D data (e.g. a 3D model and/or a set of identified surfaces) and/or a navigation interface. A user can employ an input device (e.g., a mouse, a keyboard, a touchscreen, etc.) and/or a gesture interface to select surfaces or objects, mark an area on a surface for reclassification, select a texture from a set of textures, generate modification data, etc.

Figure 5:
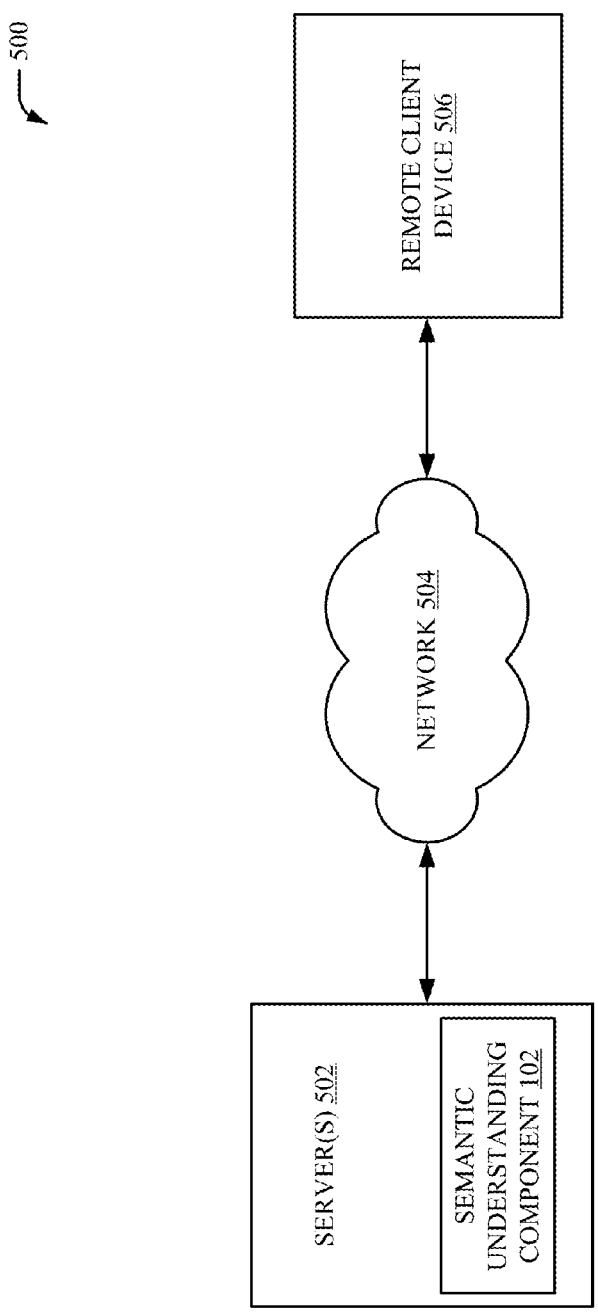
FIG. 5 illustrates a high-level block diagram of a system implementing the semantic understanding component, in accordance with various aspects and implementations described herein.

Referring to FIG. 5, there is illustrated a non-limiting implementation of a system 500 in accordance with various aspects and implementations of this disclosure. The system includes at least one server 502, a network 504 and a remote client device 506. The at least one server 502 can include at least the semantic understanding component 102. The semantic understanding component 102 can include the identification component 104 (e.g., the first identification component 202, the second identification component 204 and/or the third identification component 206), the data generation component 106, the modification component 108, the floorplan component 302 and/or the user input component 402.

The remote client device 506 can be configured to receive 3D data to render and/or display a 3D model and/or a floorplan. A 3D model and/or a floorplan can be displayed on the remote client device 506 via a model viewer. In an aspect, the at least one server 502 can be associated with a 3D reconstruction system. In another aspect, the remote client device 506 can be associated with a user (e.g., a user identity, etc.). The remote client device 506 can provide user input data associated with a user (e.g., a user identity) to the server 502 (e.g., the semantic understanding component 102 and/or the user input component 402). The remote client device 506 can include, but is not limited to, a cellular phone (e.g., a smart phone), a tablet, a personal computer (PC), a desktop computer, a laptop computer, a camera, a 3D capture system, another portable computing device, etc. The at least one server 502 can be communicably coupled to the remote client device 506 via the network 504. The network 504 can include one or more networks. For example, network 504 can include one or more wireless networks and/or one or more wired networks, including but not limited to, a cellular network, a wide area network (WAN, e.g., the Internet), a local area network (LAN) and/or a personal area network (PAN). In an example, the at least one server 502 (e.g., the semantic understanding component 102) can transmit data for a 3D model and/or a floorplan to the remote client device 506 via the network 504. As such, the remote client device 506 can receive a 3D model and/or a floorplan via virtually any desired wireless or wired technology, including, for example, cellular, WAN, WiFi, etc. In an embodiment, the modification component 108 and/or the user input component 402 can receive modification data, reclassification data, identification data and/or other user input data from the remote client device 506 (e.g., via a user interface on the remote client device 506). In another embodiment, one or more features of the modification component 108 and/or the user input component 402 can be implemented on the remote client device 506 (e.g., separate from the identification component 104, the data generation component 106 and/or the floorplan component 302 implemented on the at least one server 502).

Figure 6:
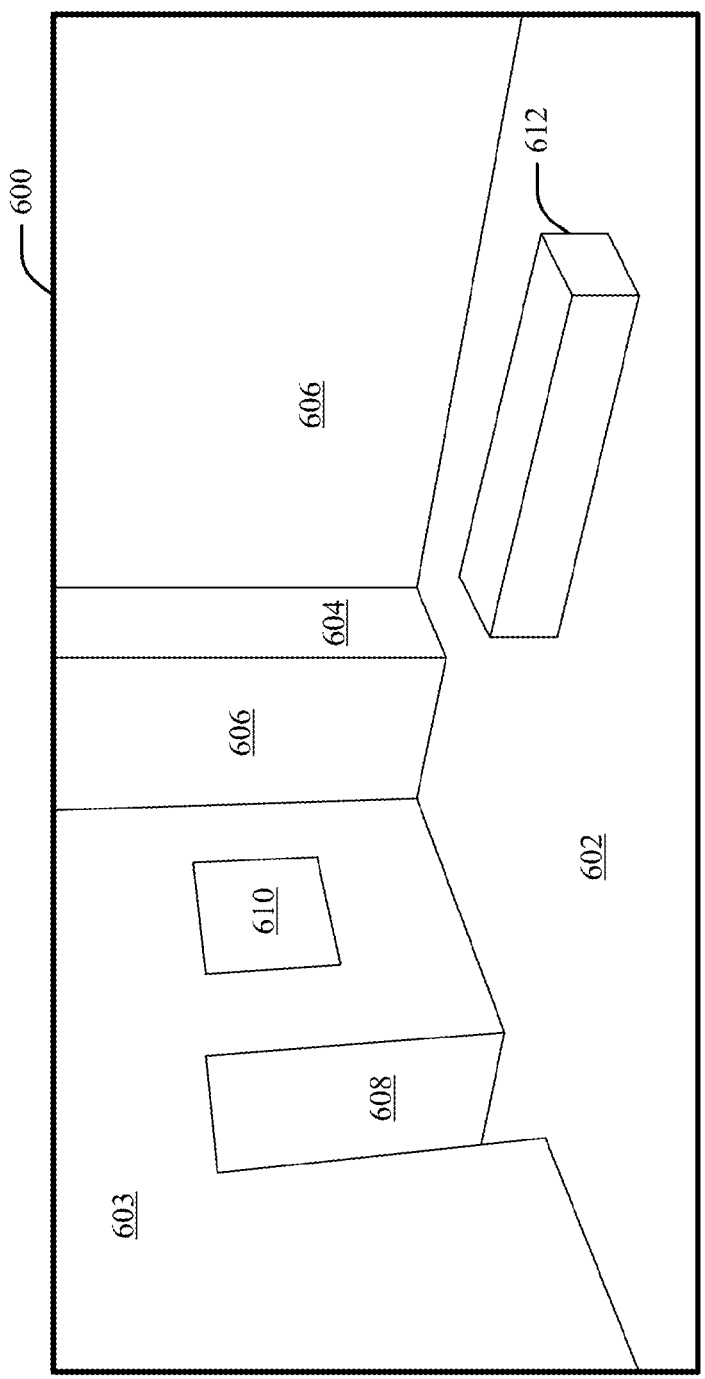
FIG. 6 illustrates semantic understanding of an architectural environment, in accordance with various aspects and implementations described herein.

Referring to FIGS. 6-10, there is illustrated a non-limiting example for employing semantic understanding via the semantic understanding component 102 to process data associated with an environment (e.g., architectural environment) 600, in accordance with various aspects and implementations of this disclosure. In FIG. 6, the environment 600 includes a floor portion 602, a wall portion 603, other wall portions 604, 606 and 608 (e.g., a wall portion 604, wall portions 606 and a wall portion 608), a window opening 610 and an object 612. The environment 600 can be an interior architectural environment. The floor portion 602, the wall portion 603, the other wall portions 604, 606 and 608, the window opening 610 and/or the object 612 can be identified by the identification component 104 (e.g., the identification component 202, the identification component 204 and/or the identification component 206). For example, the floor portion 602, the wall portion 603, and the other wall portions 604, 606 and 608 can be identified as flat surfaces (e.g., flat planes). In an aspect, the floor portion 602, the wall portion 603, and/or the other wall portions 604, 606 and 608 (e.g., a flat plane associated with the floor portion 602, the wall portion 603 and/or the other wall portions 604, 606 and 608) can be identified based on mesh data associated with the environment 600 (e.g., mesh data associated with the floor portion 602, the wall portion 603, the other wall portions 604, 606 and 608, the window opening 610 and the object 612). The wall portion 603 and/or the other wall portions 604, 606 and/or 608 can be associated with different corresponding texture data and/or different corresponding illumination data. Furthermore, the wall portion 603 and/or the other wall portions 604, 606 and/or 608 can be modified separately.

The window opening 610 can be identified as an opening (e.g., an architectural opening) associated with a flat plane related to the wall portion 603. The object 612 can be identified as an object. The wall portion 608 can be identified as a wall portion associated with a portal (e.g., a door opening). The object 612 can be identified as a physical object in a room (e.g., a living room) associated with at least the floor portion 602, the wall portion 603, the wall portion 604 and the wall portions 606. In one example, the object 612 can be a couch. However, it is to be appreciated that the object 612 can be a different type of object.

Figure 7:
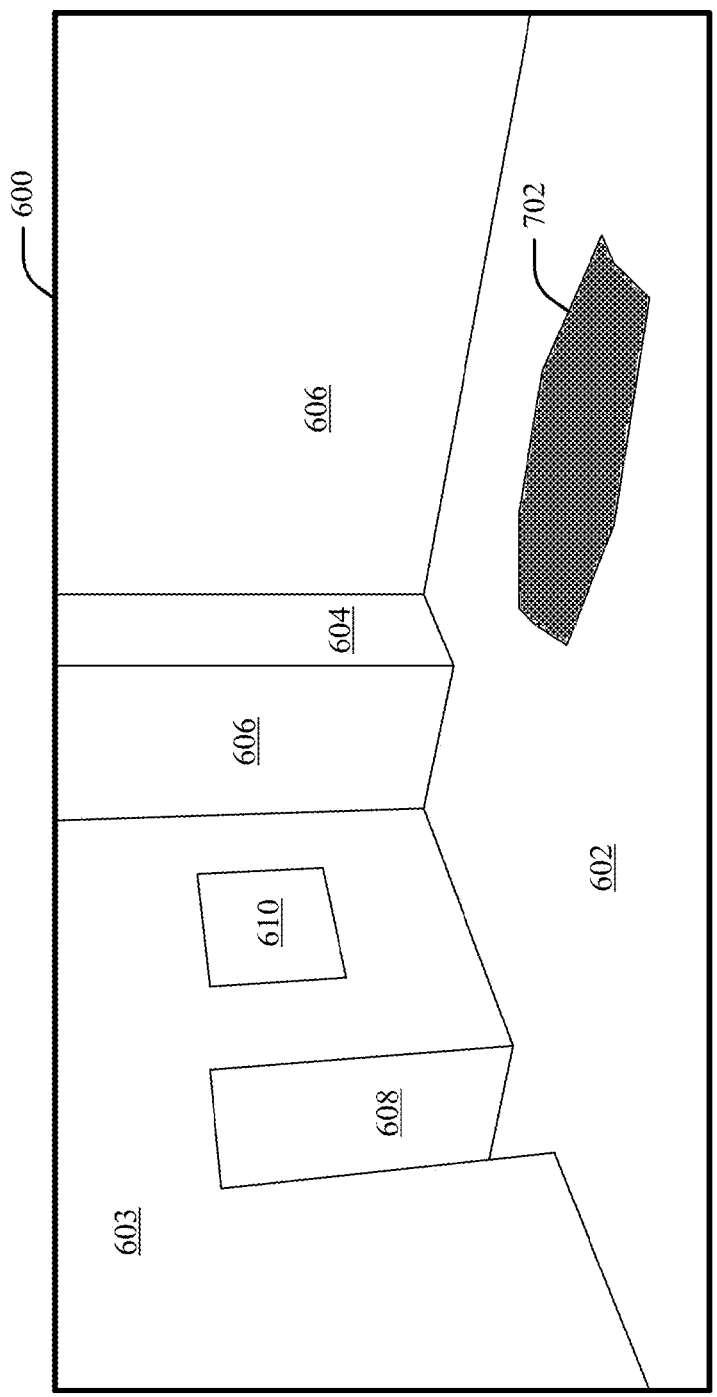
FIG. 7 further illustrates semantic understanding of an architectural environment, in accordance with various aspects and implementations described herein.
Figure 8:
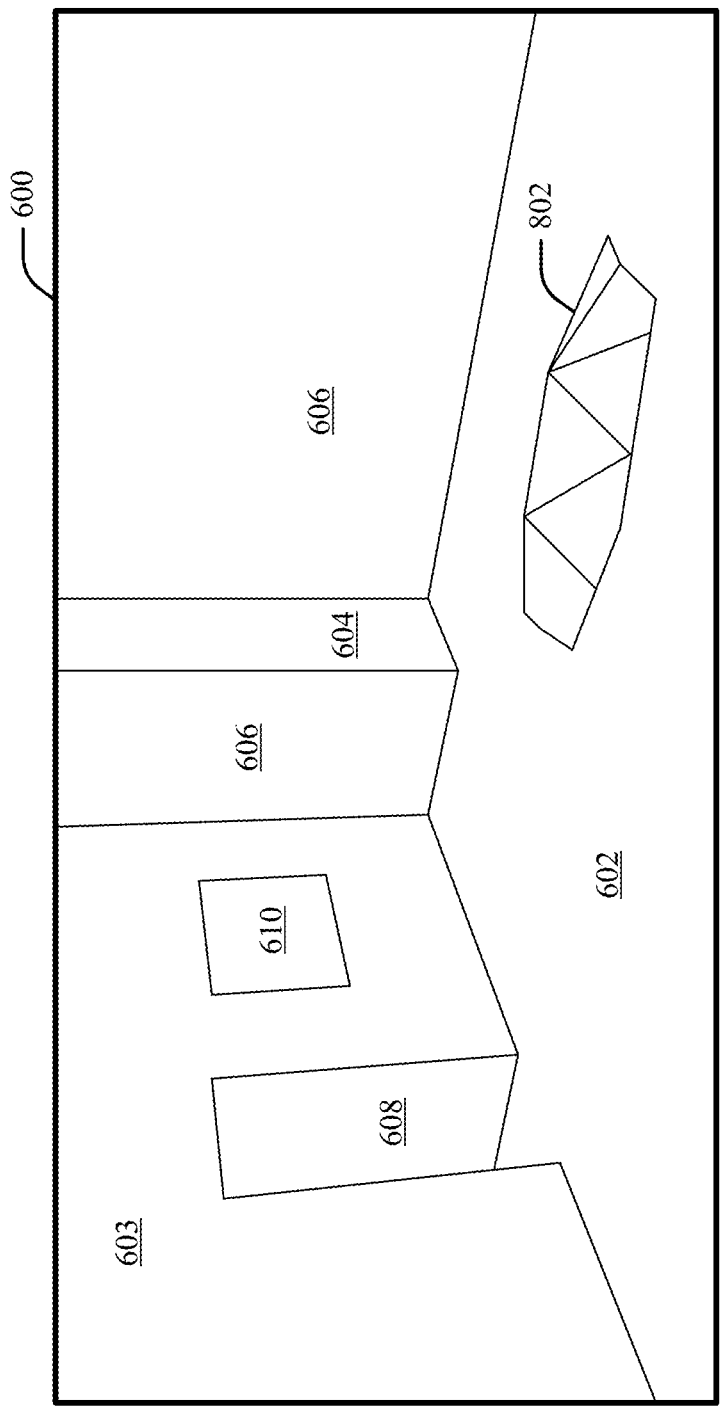
FIG. 8 further illustrates semantic understanding of an architectural environment, in accordance with various aspects and implementations described herein.
Figure 9:
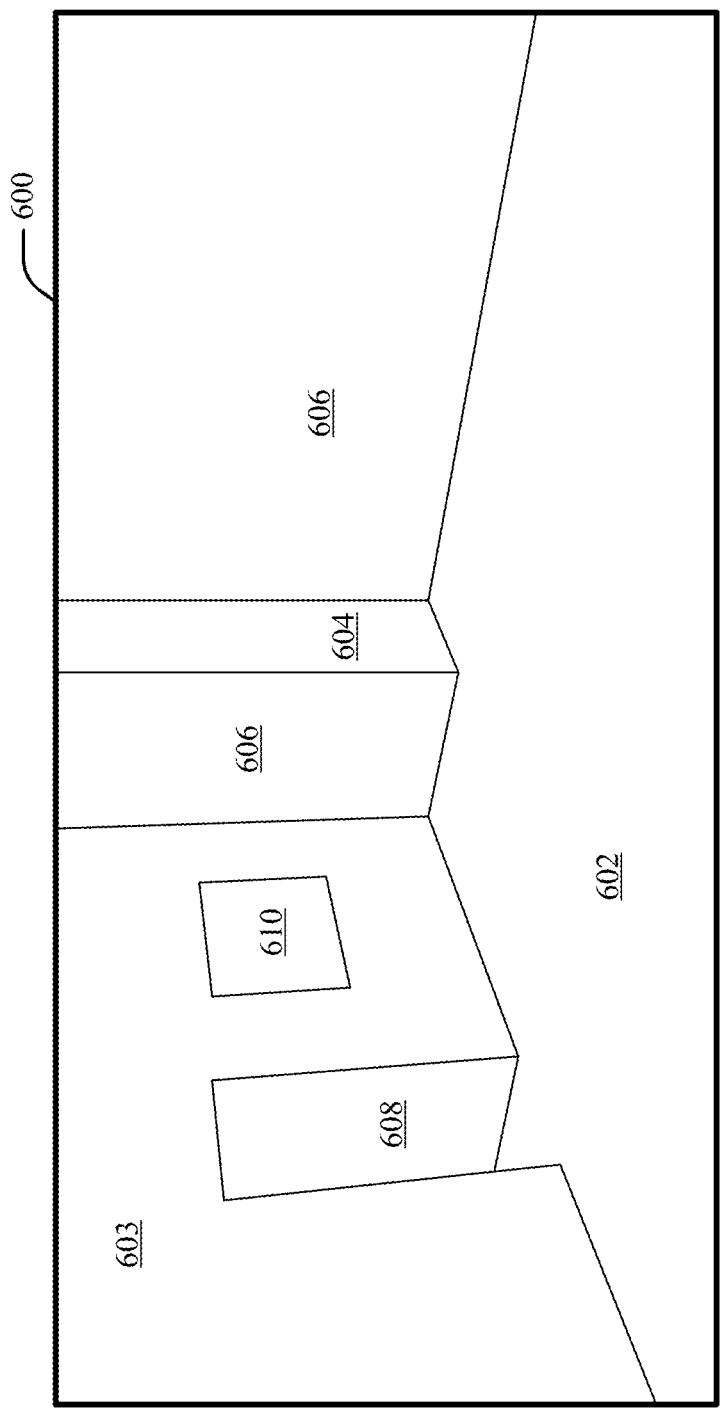
FIG. 9 further illustrates semantic understanding of an architectural environment, in accordance with various aspects and implementations described herein.
Figure 10:
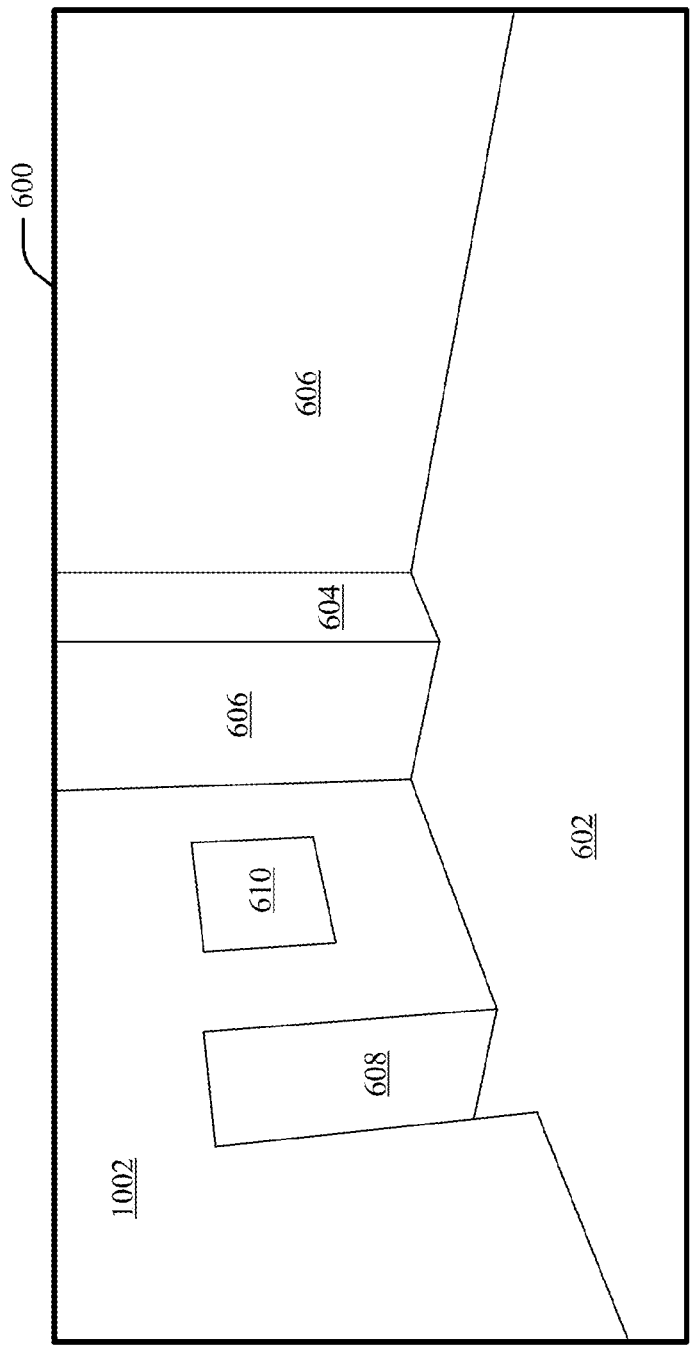
FIG. 10 illustrates modification of an architectural environment, in accordance with various aspects and implementations described herein.

In FIG. 7, the object 612 is removed. In certain scenarios, an area around the object 612 can additionally be removed from the floor portion 602. As such, the floor portion 602 can include missing data 702 (e.g., a hole 702). The missing data 702 can include uneven (e.g., irregular, jagged, etc.) edges due to a triangle mesh boundary. In FIG. 8, the missing data 702 can be replaced with mesh data 802. For example, mesh data for the missing data 702 (e.g., the hole 702) can be "filled in". In FIG. 9, texture data can be added to the mesh data 802. For example, texture data associated with the floor portion 602 (e.g., texture data surrounding an area related to the missing data 702) can be employed to further "fill in" missing data. In FIG. 10, the wall portion 603 associated with the window opening 610 can be modified (e.g., retextured). For example, the wall portion 603 associated with the window opening 610 can be identified as a plane. The wall portion 603 associated with the window opening 610 can also be associated with a particular texture. Furthermore, the window opening 610 can include a different texture. As such, the window opening 610 can be identified as being separate from the wall portion 603 based on the different texture. Accordingly, the wall portion 603 can be modified and/or retextured (e.g., via the modification component 108) as a wall portion 1002.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

FIGS. 11-14 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device or storage media.

Figure 11:
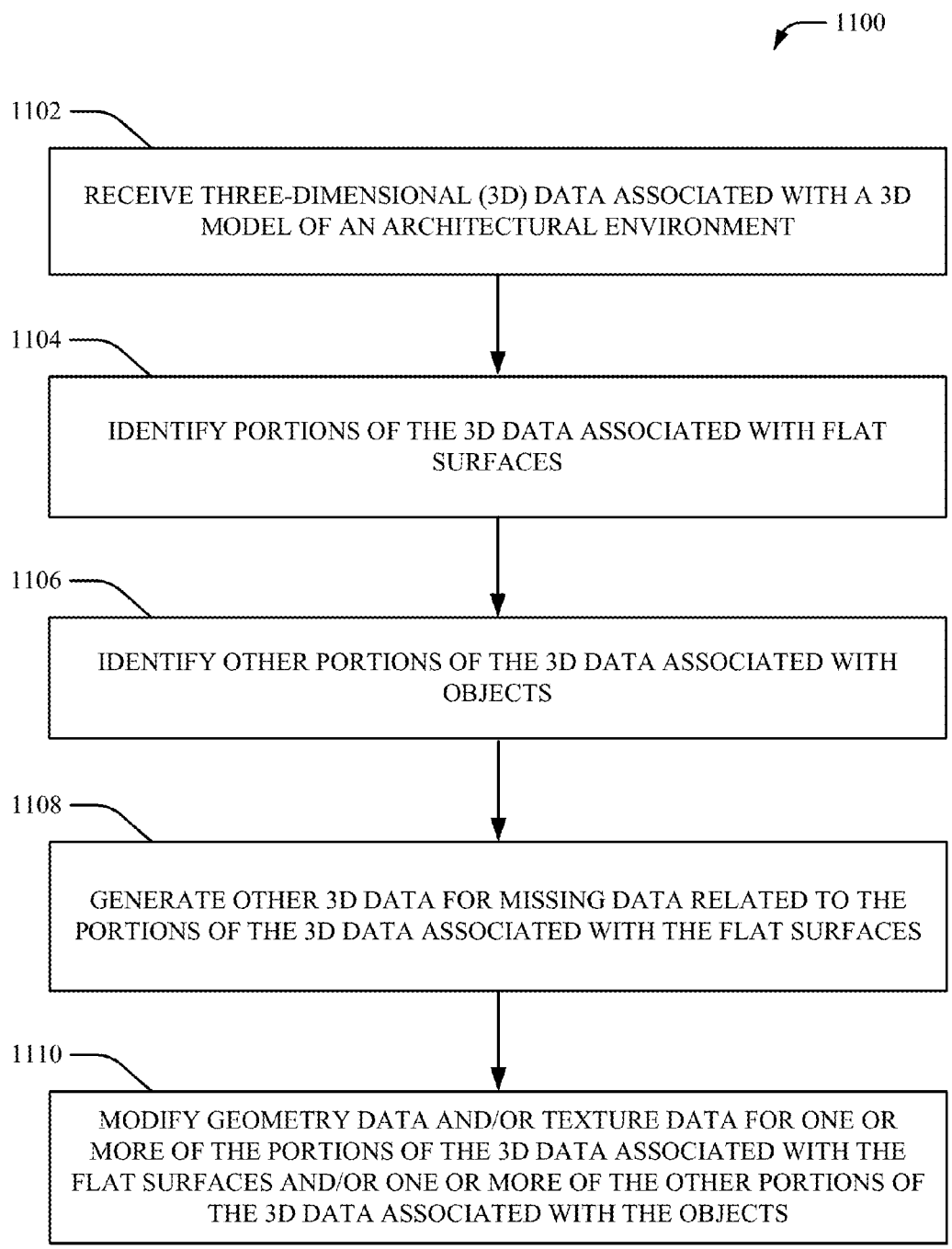
FIG. 11 depicts a flow diagram of an example method for processing 3D data, in accordance with various aspects and implementations described herein.

Referring to FIG. 11, there illustrated is a methodology 1100 for processing 3D data, according to an aspect of the subject innovation. As an example, methodology 600 can be utilized in various applications, such as, but not limited to, 3D modeling systems, 3D reconstruction systems, server systems, cloud-based systems, etc. At 1102, three-dimensional (3D) data associated with a 3D model of an architectural environment is received (e.g., by an identification component 104). At 1104, portions of the 3D data associated with flat surfaces are identified (e.g., by a first identification component 202). At 1106, other portions of the 3D data associated with objects are identified (e.g., by a second identification component 204). At 1108, other 3D data for missing data related to the portions of the 3D data associated with the flat surfaces is generated (e.g., by a data generation component 106). At 1110, geometry data and/or texture data for one or more of the portions of the 3D data associated with the flat surfaces and/or one or more of the other portions of the 3D data associated with the objects is modified (e.g., by a modification component 108).

Figure 12:
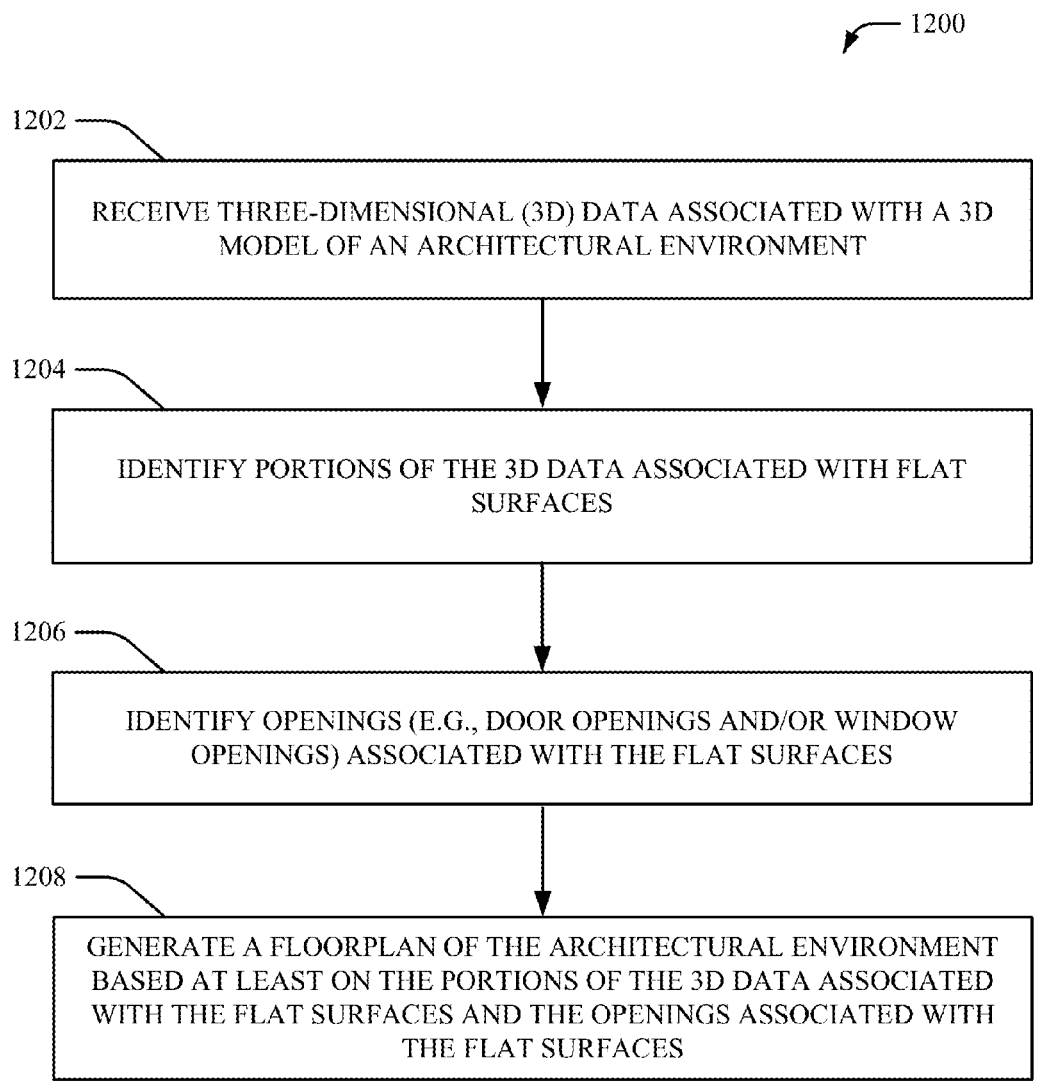
FIG. 12 depicts a flow diagram of another example method for processing 3D data, in accordance with various aspects and implementations described herein.

Referring to FIG. 12, there illustrated is a methodology 1200 for processing 3D data, according to another aspect of the subject innovation. At 1202, three-dimensional (3D) data associated with a 3D model of an architectural environment is received (e.g., by an identification component 104). At 1204, portions of the 3D data associated with flat surfaces are identified (e.g., by a first identification component 202). At 1206, openings (e.g., door openings and/or window openings) associated with the flat surfaces are identified (e.g., by a third identification component 206). At 1208, a floorplan of the architectural environment is generated (e.g., by a floorplan component 302) based at least on the portions of the 3D data associated with the flat surfaces and the openings associated with the flat surfaces.

Figure 13:
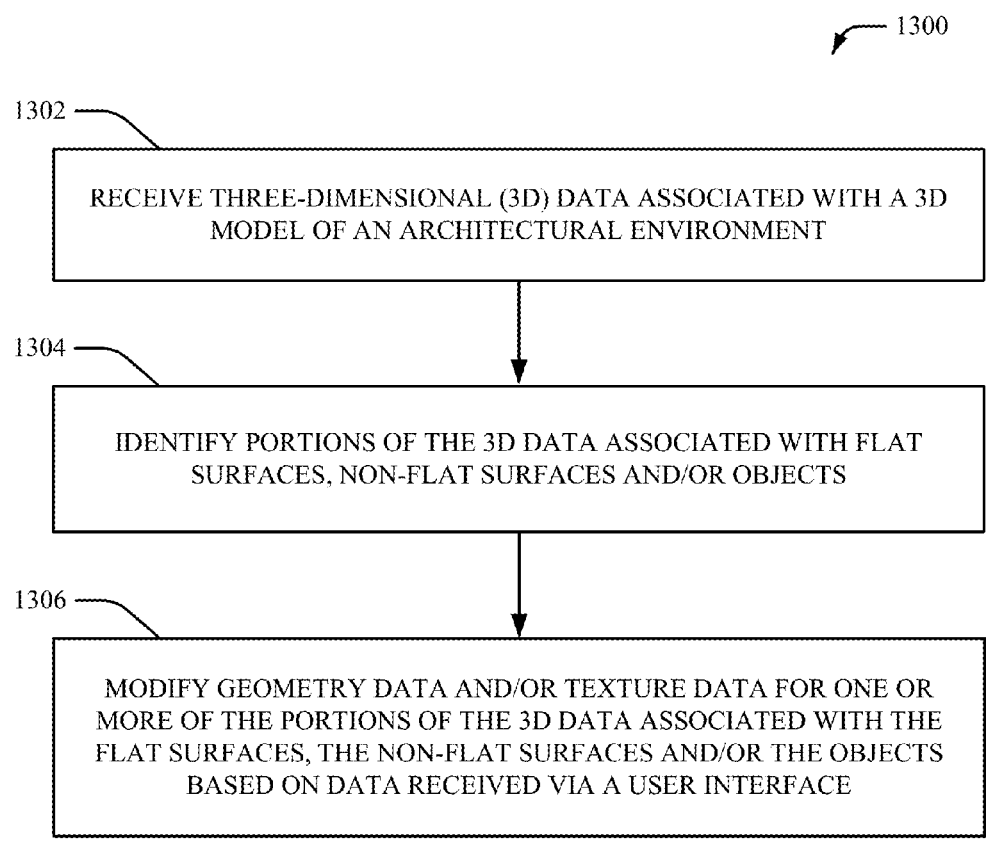
FIG. 13 depicts a flow diagram of yet another example method for processing 3D data, in accordance with various aspects and implementations described herein.

Referring to FIG. 13, there illustrated is a methodology 1300 for processing 3D data, according to yet another aspect of the subject innovation. At 1302, three-dimensional (3D) data associated with a 3D model of an architectural environment is received (e.g., by an identification component 104). At 1304, portions of the 3D data associated with flat surfaces, non-flat surfaces and/or objects are identified (e.g., by a first identification component 202 and/or a second identification component 204). At 1306, geometry data and/or texture data for one or more of the portions of the 3D data associated with the flat surfaces, the non-flat surfaces and/or the objects is modified based on data received via a user interface (e.g., using a modification component 108 and/or a user input component 402).

Figure 14:
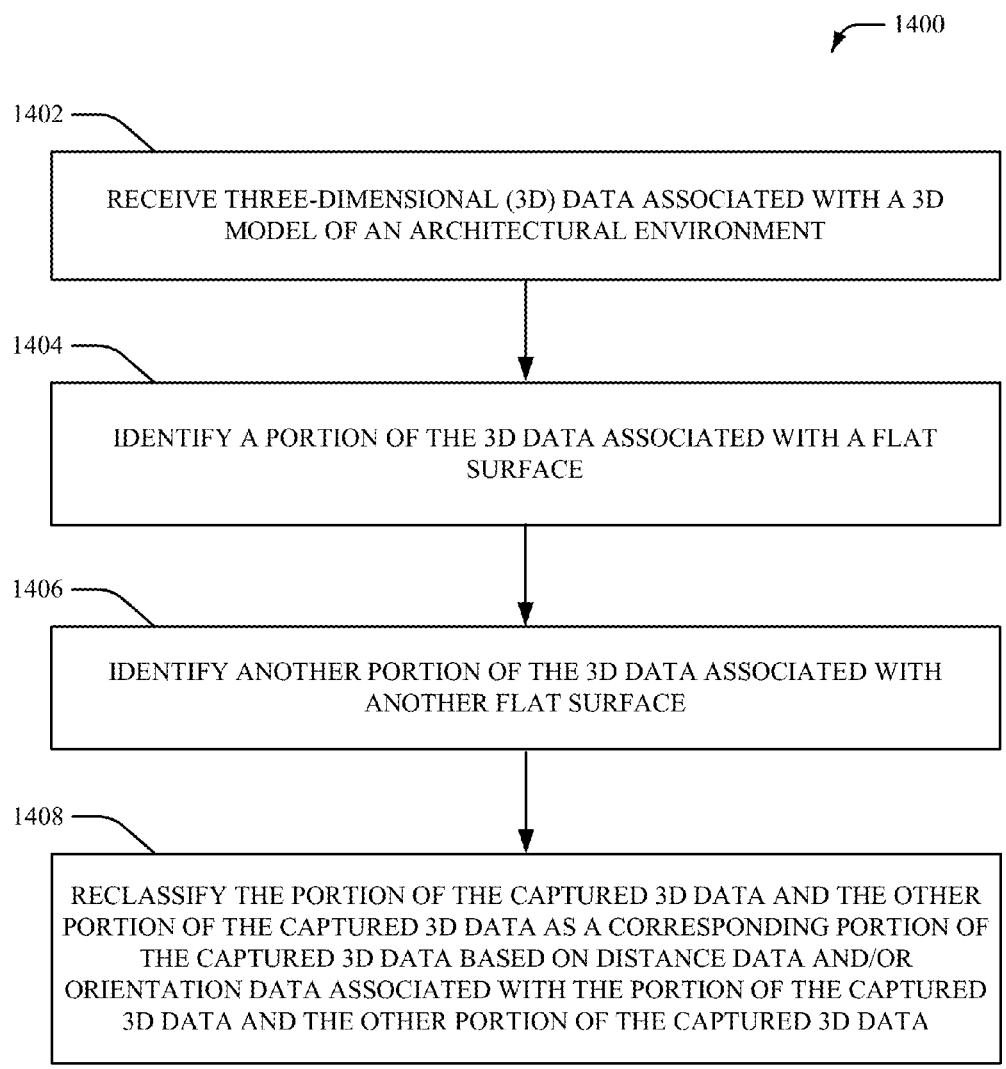
FIG. 14 depicts a flow diagram of yet another example method for processing 3D data, in accordance with various aspects and implementations described herein.

Referring to FIG. 14, there illustrated is a methodology 1400 for processing 3D data, according to yet another aspect of the subject innovation. At 1402, three-dimensional (3D) data associated with a 3D model of an architectural environment is received (e.g., by an identification component 104). At 1404, a portion of the 3D data associated with a flat surface is identified (e.g., by an identification component 104). At 1406, another portion of the 3D data associated with another flat surface is identified (e.g., by an identification component 104). In one example, the other flat surface can be different than the flat surface. In another example, the other flat surface can correspond to (e.g., can be the same as) the flat surface. At 1408, the portion of the captured 3D data and the other portion of the captured 3D data are reclassified as a corresponding portion of the captured 3D data (e.g., using an identification component 104) based on distance data and/or orientation data associated with the portion of the captured 3D data and the other portion of the captured 3D data. For example, the portion of the captured 3D data and the other portion of the captured 3D data can be reclassified as the same flat surface (e.g., the portion of the captured 3D data and the other portion of the captured 3D data can correspond to a single flat surface and/or be reclassified as corresponding data).

Figure 15:
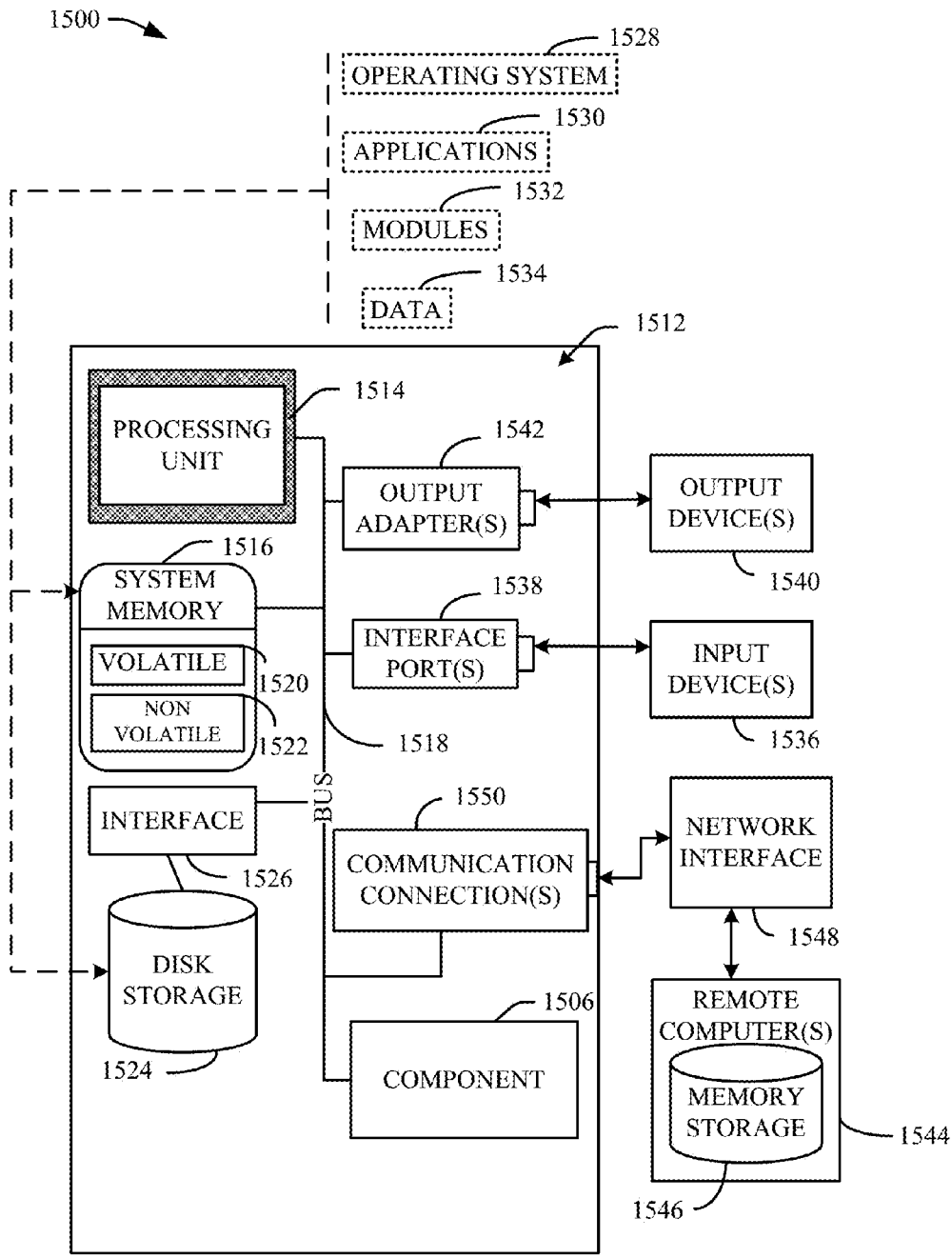
FIG. 15 is a schematic block diagram illustrating a suitable operating environment.
Figure 16:
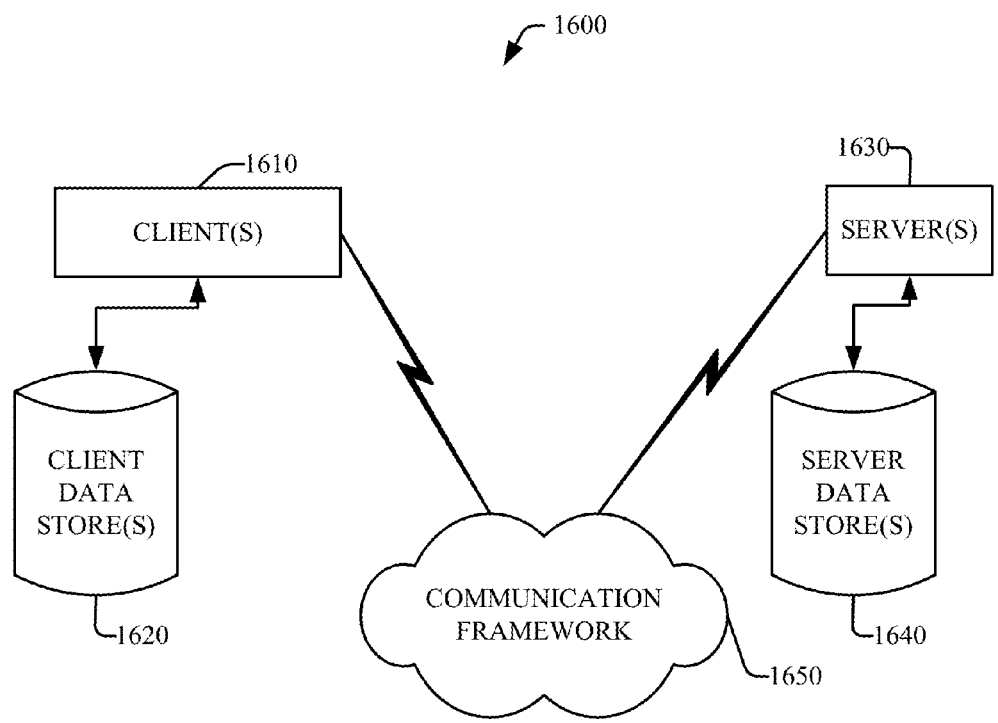
FIG. 16 is a schematic block diagram of a sample-computing environment.

In order to provide a context for the various aspects of the disclosed subject matter, FIGS. 15 and 16 as well as the following discussion are intended to provide a brief, general description of a suitable environment in which the various aspects of the disclosed subject matter may be implemented.

With reference to FIG. 15, a suitable environment 1500 for implementing various aspects of this disclosure includes a computer 1512. The computer 1512 includes a processing unit 1514, a system memory 1516, and a system bus 1518. The system bus 1518 couples system components including, but not limited to, the system memory 1516 to the processing unit 1514. The processing unit 1514 can be any of various available processors. Dual microprocessors and other multiprocessor architectures also can be employed as the processing unit 1514.

The system bus 1518 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1516 includes volatile memory 1520 and nonvolatile memory 1522. The basic input/output system (BIOS), containing the basic routines to transfer information between elements within the computer 1512, such as during start-up, is stored in nonvolatile memory 1522. By way of illustration, and not limitation, nonvolatile memory 1522 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1520 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1512 also includes removable/non-removable, volatile/non-volatile computer storage media. FIG. 15 illustrates, for example, a disk storage 1524. Disk storage 1524 includes, but is not limited to, devices like a magnetic disk drive, floppy disk drive, tape drive, Jaz drive, Zip drive, LS-100 drive, flash memory card, or memory stick. The disk storage 1524 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1524 to the system bus 1518, a removable or non-removable interface is typically used, such as interface 1526.

FIG. 15 also depicts software that acts as an intermediary between users and the basic computer resources described in the suitable operating environment 1500. Such software includes, for example, an operating system 1528. Operating system 1528, which can be stored on disk storage 1524, acts to control and allocate resources of the computer system 1512. System applications 1530 take advantage of the management of resources by operating system 1528 through program modules 1532 and program data 1534, e.g., stored either in system memory 1516 or on disk storage 1524. It is to be appreciated that this disclosure can be implemented with various operating systems or combinations of operating systems.

A user enters commands or information into the computer 1512 through input device(s) 1536. Input devices 1536 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1514 through the system bus 1518 via interface port(s) 1538. Interface port(s) 1538 include, for example, a serial port, a parallel port, a game port, and a universal serial bus (USB). Output device(s) 1540 use some of the same type of ports as input device(s) 1536. Thus, for example, a USB port may be used to provide input to computer 1512, and to output information from computer 1512 to an output device 1540. Output adapter 1542 is provided to illustrate that there are some output devices 1540 like monitors, speakers, and printers, among other output devices 1540, which require special adapters. The output adapters 1542 include, by way of illustration and not limitation, video and sound cards that provide a means of connection between the output device 1540 and the system bus 1518. It should be noted that other devices and/or systems of devices provide both input and output capabilities such as remote computer(s) 1544.

Computer 1512 can operate in a networked environment using logical connections to one or more remote computers, such as remote computer(s) 1544. The remote computer(s) 1544 can be a personal computer, a server, a router, a network PC, a workstation, a microprocessor based appliance, a peer device or other common network node and the like, and typically includes many or all of the elements described relative to computer 1512. For purposes of brevity, only a memory storage device 1546 is illustrated with remote computer(s) 1544. Remote computer(s) 1544 is logically connected to computer 1512 through a network interface 1548 and then physically connected via communication connection 1550. Network interface 1548 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1550 refers to the hardware/software employed to connect the network interface 1548 to the bus 1518. While communication connection 1550 is shown for illustrative clarity inside computer 1512, it can also be external to computer 1512. The hardware/software necessary for connection to the network interface 1548 includes, for exemplary purposes only, internal and external technologies such as, modems including regular telephone grade modems, cable modems and DSL modems, ISDN adapters, and Ethernet cards.

It is to be appreciated that the computer 1512 can be used in connection with implementing one or more of the systems, components and/or methodologies shown and described in connection with FIGS. 1-14. In accordance with various aspects and implementations, the computer 1512 can be used to facilitate processing (e.g., identifying, segmenting, augmenting and/or modifying) 3D data. In certain exemplary embodiments, the computer 1512 includes a component 1506 (e.g., the semantic understanding component 102) that can contain, for example, an identification component, a data generation component, a modification component, a floorplan component, a user input component, a first identification component, a second identification component and/or a third identification component, each of which can respectively function as more fully disclosed herein. In an aspect, the component 1506 can be implemented in and/or in connection with the system memory 1516.

FIG. 16 is a schematic block diagram of a sample-computing environment 1600 with which the subject matter of this disclosure can interact. The system 1600 includes one or more client(s) 1610. The client(s) 1610 can be hardware and/or software (e.g., threads, processes, computing devices). The system 1600 also includes one or more server(s) 1630. Thus, system 1600 can correspond to a two-tier client server model or a multi-tier model (e.g., client, middle tier server, data server), amongst other models. The server(s) 1630 can also be hardware and/or software (e.g., threads, processes, computing devices). The servers 1630 can house threads to perform transformations by employing this disclosure, for example. One possible communication between a client 1610 and a server 1630 may be in the form of a data packet transmitted between two or more computer processes.

The system 1600 includes a communication framework 1650 that can be employed to facilitate communications between the client(s) 1610 and the server(s) 1630. The client(s) 1610 are operatively connected to one or more client data store(s) 1620 that can be employed to store information local to the client(s) 1610. Similarly, the server(s) 1630 are operatively connected to one or more server data store(s) 1640 that can be employed to store information local to the servers 1630.

It is to be noted that aspects or features of this disclosure can be exploited in substantially any wireless telecommunication or radio technology, e.g., Wi-Fi; Bluetooth; Worldwide Interoperability for Microwave Access (WiMAX); Enhanced General Packet Radio Service (Enhanced GPRS); Third Generation Partnership Project (3GPP) Long Term Evolution (LTE); Third Generation Partnership Project 2 (3GPP2) Ultra Mobile Broadband (UMB); 3GPP Universal Mobile Telecommunication System (UMTS); High Speed Packet Access (HSPA); High Speed Downlink Packet Access (HSDPA); High Speed Uplink Packet Access (HSUPA); GSM (Global System for Mobile Communications) EDGE (Enhanced Data Rates for GSM Evolution) Radio Access Network (GERAN); UMTS Terrestrial Radio Access Network (UTRAN); LTE Advanced (LTE-A); etc. Additionally, some or all of the aspects described herein can be exploited in legacy telecommunication technologies, e.g., GSM. In addition, mobile as well non-mobile networks (e.g., the Internet, data service network such as internet protocol television (IPTV), etc.) can exploit aspects or features described herein.

While the subject matter has been described above in the general context of computer-executable instructions of a computer program that runs on a computer and/or computers, those skilled in the art will recognize that this disclosure also can or may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., PDA, phone), microprocessor-based or programmable consumer or industrial electronics, and the like. The illustrated aspects may also be practiced in distributed computing environments where tasks are performed by remote processing devices that are linked through a communications network. However, some, if not all aspects of this disclosure can be practiced on stand-alone computers. In a distributed computing environment, program modules may be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

In another example, respective components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

Various aspects or features described herein can be implemented as a method, apparatus, system, or article of manufacture using standard programming or engineering techniques. In addition, various aspects or features disclosed in this disclosure can be realized through program modules that implement at least one or more of the methods disclosed herein, the program modules being stored in a memory and executed by at least a processor. Other combinations of hardware and software or hardware and firmware can enable or implement aspects described herein, including a disclosed method(s). The term "article of manufacture" as used herein can encompass a computer program accessible from any computer-readable device, carrier, or storage media. For example, computer readable storage media can include but are not limited to magnetic storage devices (e.g., hard disk, floppy disk, magnetic strips . . . ), optical discs (e.g., compact disc (CD), digital versatile disc (DVD), blu-ray disc (BD) . . . ), smart cards, and flash memory devices (e.g., card, stick, key drive . . . ), or the like.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor may also be implemented as a combination of computing processing units.

In this disclosure, terms such as "store," "storage," "data store," data "storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory.

By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or methods herein are intended to include, without being limited to including, these and any other suitable types of memory.

It is to be appreciated and understood that components (e.g., semantic understanding component, identification component, data generation component, modification component, floorplan component, user input component, first identification component, second identification component, third identification component, etc.), as described with regard to a particular system or method, can include the same or similar functionality as respective components (e.g., respectively named components or similarly named components) as described with regard to other systems or methods disclosed herein.

What has been described above includes examples of systems and methods that provide advantages of this disclosure. It is, of course, not possible to describe every conceivable combination of components or methods for purposes of describing this disclosure, but one of ordinary skill in the art may recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
a memory storing computer executable components; and
a processor configured to execute the following computer executable components stored in the memory:
an identification component that receives captured three-dimensional (3D) data associated with a 3D model of an architectural environment and identifies at least a portion of the captured 3D data associated with a flat surface of an architectural element for the 3D model; and
a data generation component that identifies missing data associated with the portion of the captured 3D data and generates additional 3D data for the missing data based on other data related to the portion of the captured 3D data associated with the flat surface of the architectural element for the 3D model.

2. The system of claim 1, wherein the identification component identifies at least the portion of the captured 3D data associated with the flat surface based on texture data for the 3D model of the architectural environment.

3. The system of claim 2, wherein the identification component identifies the missing data associated with the portion of the captured 3D data based on boundary data associated with the other portion of the captured 3D data.

4. The system of claim 2, wherein the data generation component identifies the other portion of the captured 3D data associated with the object based on proximity data in relation to the portion of the captured 3D data.

5. The system of claim 2, wherein the identification component generates an object relation identifier for the portion of the captured 3D data associated with the flat surface and the other portion of the captured 3D data associated with the object.

6. The system of claim 2, further comprising a modification component that modifies position or orientation of the other portion of the captured 3D data associated with the object.

7. The system of claim 6, wherein the modification component modifies the position or the orientation of the other portion of the captured 3D data associated with the object based on input received via a user interface.

8. The system of claim 1, wherein the identification component identifies an opening associated with the portion of the captured 3D data.

9. The system of claim 8, wherein the identification component classifies the opening as a window opening or a door opening based on information associated with the opening.

10. The system of claim 1, wherein the identification component classifies the portion of the captured 3D data surface as a floor, a wall or a ceiling based on orientation information associated with the portion of the captured 3D data.

11. The system of claim 1, wherein the identification component defines a boundary associated with the flat surface.

12. The system of claim 1, further comprising a modification component that modifies geometry data or texture data for the portion of the captured 3D data.

13. The system of claim 12, wherein the modification component modifies the geometry data or the texture data for the portion of the captured 3D data based on input data received via a user interface.

14. The system of claim 12, wherein the modification component determines illumination data associated with the texture data that is applied when modifying the texture data.

15. A method, comprising:
employing a processor that facilitates execution of computer executable instructions stored on a non-transitory computer readable medium to implement operations, comprising:
receiving captured three-dimensional (3D) data associated with a 3D model of an architectural environment;
identifying at least a portion of the captured 3D data associated with a flat plane of an architectural element for the 3D model;
identifying omitted data associated with the portion of the captured 3D data; and
generating other 3D data for the omitted data based on the portion of the captured 3D data associated with the flat plane of the architectural element for the 3D model.

16. The method of claim 15, further comprising identifying another portion of the captured 3D data associated with an object.

17. The method of claim 16, wherein the identifying the omitted data comprises identifying the omitted data associated with the portion of the captured 3D data based on at least one border of the other portion of the captured 3D data.

18. The method of claim 16, wherein the identifying the other portion of the captured 3D data associated with the object comprises identifying the other portion of the captured 3D data associated with the object based on texture data associated with the portion of the captured 3D data and the other portion of the captured 3D data.

19. The method of claim 16, further comprising generating object relation data associated with the portion of the captured 3D data and the other portion of the captured 3D data.

20. The method of claim 15, further comprising identifying a rectangular opening associated with the portion of the captured 3D data.

21. The method of claim 15, further comprising:
identifying another portion of the captured 3D data associated with another flat plane; and
reclassifying the portion of the captured 3D data and the other portion of the captured 3D data as corresponding data based on at least distance data associated with the portion of the captured 3D data and the other portion of the captured 3D data.

22. The method of claim 21, wherein the reclassifying comprises reclassifying the portion of the captured 3D data and the other portion of the captured 3D data as the corresponding data based on orientation data associated with the portion of the captured 3D data and the other portion of the captured 3D data.

23. The method of claim 15, further comprising modifying geometry data or texture data for the portion of the captured 3D data based on data received via a user interface.

24. A computer readable storage device comprising instructions that, in response to execution, cause a system comprising a processor to perform operations, comprising:

receiving three-dimensional (3D) data associated with a 3D model of an architectural environment;
identifying at least a portion of the 3D data associated with a flat surface of an architectural feature of the 3D model;
identifying at least another portion of the 3D data associated with missing data; and
generating additional 3D data for the missing data based on the portion of the 3D data associated with the flat surface of the architectural feature of the 3D model.

* * * * *